United States Patent
Liu et al.

(10) Patent No.: US 10,483,434 B2
(45) Date of Patent: Nov. 19, 2019

(54) DISPLAY DEVICES AND METHODS FOR FORMING DISPLAY DEVICES

(71) Applicant: InnoLux Corporation, Miao-Li County (TW)

(72) Inventors: Tung-Kai Liu, Miao-Li County (TW); Tsau-Hua Hsieh, Miao-Li County (TW); Hui-Chieh Wang, Miao-Li County (TW); Shu-Ming Kuo, Miao-Li County (TW); Ming-I Chao, Miao-Li County (TW); Shun-Yuan Hu, Miao-Li County (TW)

(73) Assignee: INNOLUX CORPORATION, Miao-Li (TW)

( * ) Notice: Subject to any disclaimer, the term of this patent is extended or adjusted under 35 U.S.C. 154(b) by 0 days.

(21) Appl. No.: 15/659,947

(22) Filed: Jul. 26, 2017

(65) Prior Publication Data
US 2018/0190876 A1    Jul. 5, 2018

Related U.S. Application Data

(60) Provisional application No. 62/465,869, filed on Mar. 2, 2017, provisional application No. 62/441,579, filed on Jan. 3, 2017.

(51) Int. Cl.
*H01L 33/44* (2010.01)
*H01L 33/62* (2010.01)
(Continued)

(52) U.S. Cl.
CPC .............. *H01L 33/44* (2013.01); *H01L 33/62* (2013.01); *H01L 25/0753* (2013.01);
(Continued)

(58) Field of Classification Search
CPC ... H01L 25/0753; H01L 25/167; H01L 33/44; H01L 33/62; H01L 51/0024; H01L 51/0096; H01L 51/524; H01L 51/5253
See application file for complete search history.

(56) References Cited

U.S. PATENT DOCUMENTS 6,965,361 B1    11/2005    Sheats et al.
9,000,461 B2    4/2015    Han et al.
(Continued)

FOREIGN PATENT DOCUMENTS

CN    1527643 A    9/2004
CN    102931318 A    2/2013
(Continued)

OTHER PUBLICATIONS

European Search Report dated Jun. 5, 2018, issued in application No. 17209569.7-1211.
(Continued)

*Primary Examiner* — Cuong Q Nguyen
(74) *Attorney, Agent, or Firm* — McClure, Qualey & Rodack, LLP

(57) ABSTRACT

A display device is provided. The display device includes a thin-film transistor substrate, a conductive pad disposed on the thin-film transistor substrate, and an adhesion film disposed on the conductive pad. The adhesion film includes a plurality of conductive particles. The display device also includes a light-emitting component disposed on the adhesion film. The light-emitting component includes a connection feature. The display device also includes a protection layer partially surrounding the light-emitting component. The connection feature of the light-emitting component has a lower portion not surrounded by the protection layer. The adhesion film has a thickness of T, one of the plurality of
(Continued)

conductive particles has a diameter of d, the lower portion of the connection feature has a thickness of t, and $0 < t \leq T-d$.

18 Claims, 25 Drawing Sheets

(51) Int. Cl.
    *H01L 25/075*     (2006.01)
    *H01L 25/16*     (2006.01)

(52) U.S. Cl.
    CPC .. *H01L 25/167* (2013.01); *H01L 2224/16225* (2013.01); *H01L 2933/0025* (2013.01); *H01L 2933/0066* (2013.01)

(56) References Cited

U.S. PATENT DOCUMENTS

| | | | |
|---|---|---|---|
| 9,837,388 | B2 | 12/2017 | Rhee et al. |
| 2014/0175481 | A1 | 6/2014 | Tischler |
| 2015/0236230 | A1 | 8/2015 | Miyata |
| 2015/0236293 | A1* | 8/2015 | Lee ............. H01L 51/524 257/40 |
| 2015/0295146 | A1* | 10/2015 | Ikegami ......... H01L 33/502 257/98 |
| 2016/0087179 | A1 | 3/2016 | Tischler |
| 2017/0352716 | A1* | 12/2017 | Lee ............. H01L 51/0096 |
| 2017/0352834 | A1* | 12/2017 | Kim ............. H01L 51/5253 |

FOREIGN PATENT DOCUMENTS

| | | |
|---|---|---|
| CN | 105474747 A | 4/2016 |
| JP | 2009246078 A | 10/2009 |
| KR | 10-2012-0130846 A | 12/2012 |
| WO | 2014/140796 A1 | 9/2014 |
| WO | 2015/026033 A1 | 2/2015 |

OTHER PUBLICATIONS

Chinese Office Action dated Jul. 29, 2019 in Chinese application (No. 201711472089.1).

\* cited by examiner

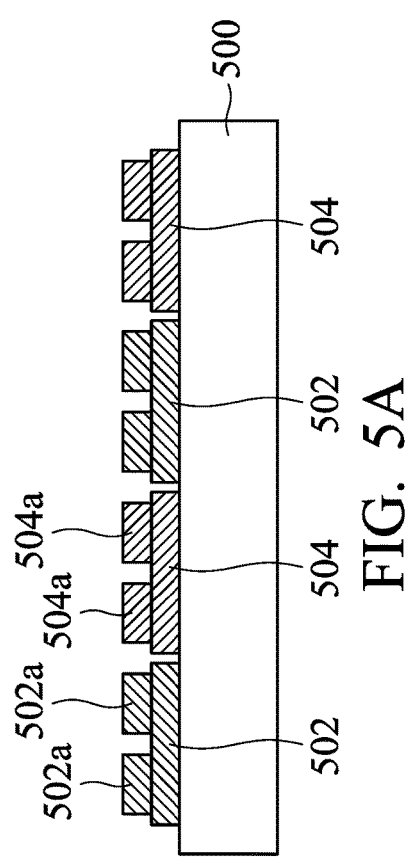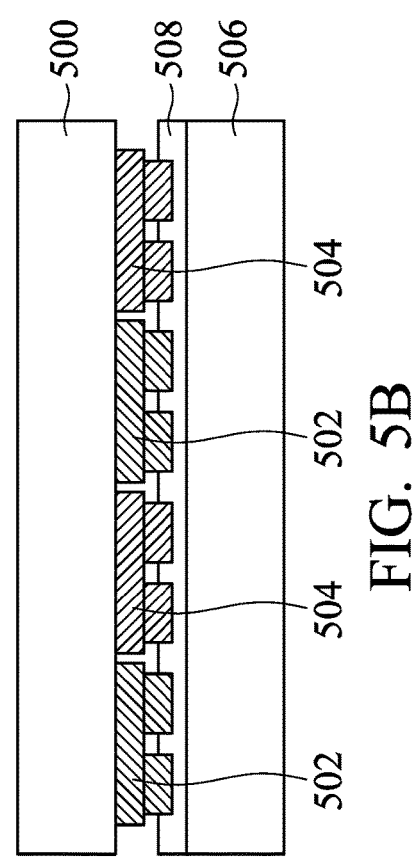

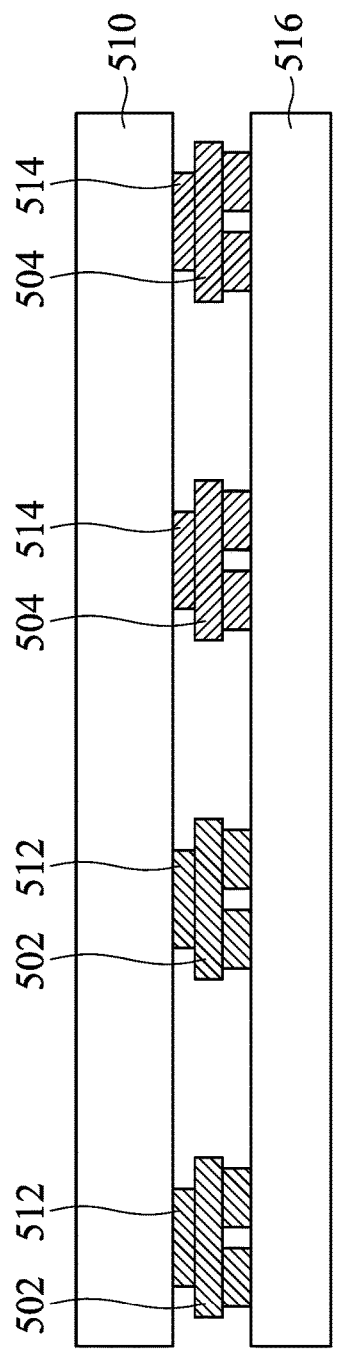
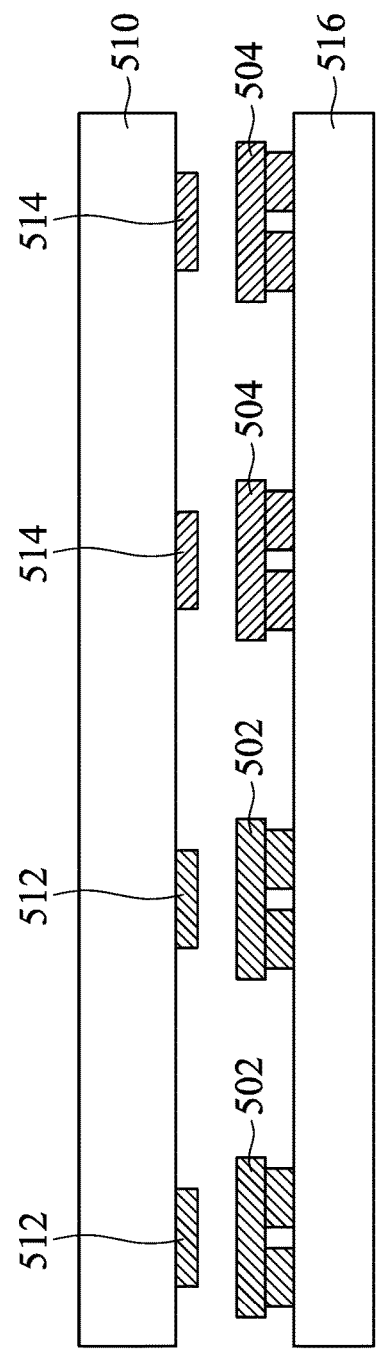
FIG. 5I
FIG. 5J

DISPLAY DEVICES AND METHODS FOR FORMING DISPLAY DEVICES

CROSS REFERENCE TO RELATED APPLICATIONS

This application claims priority of provisional applications of, U.S. Patent Application No. 62/441,579 filed on Jan. 3, 2017, and U.S. Patent Application No. 62/465,869 filed on Mar. 2, 2017, the entirety of which are incorporated by reference herein.

BACKGROUND

Technical Field

The disclosure relates to display devices, and in particular to display devices that include a light-emitting component surrounded by a protection layer.

Description of the Related Art

As digital technology develops, display devices are becoming more widely used in our society. For example, display devices have been applied in modern information and communication devices such as televisions, notebooks, computers, mobile phones, and smartphones. In addition, each generation of display devices has been developed to be thinner, lighter, smaller, and more fashionable than the previous generation.

Among the various types of display devices, light-emitting diode (LED) display devices are gaining in popularity, since LEDs have such advantages as high efficiency and a long life span.

However, existing LED display devices have not been satisfactory in every respect.

BRIEF SUMMARY

Some embodiments of the disclosure provide a display device. The display device includes a thin-film transistor substrate, a conductive pad disposed on the thin-film transistor substrate, and an adhesion film disposed on the conductive pad. The adhesion film includes a plurality of conductive particles. The display device also includes a light-emitting component disposed on the adhesion film. The light-emitting component includes a connection feature. The display device also includes a protection layer partially surrounding the light-emitting component. The connection feature of the light-emitting component has a lower portion not surrounded by the protection layer. The adhesion film has a thickness of T, one of the plurality of conductive particles has a diameter of d, the lower portion of the connection feature has a thickness of t, and 0<t≤T−d.

Some embodiments of the disclosure provide a method for forming a display device. The method includes providing a first temporary substrate with a first adhesion film thereon, providing a carrier with a plurality of light-emitting components thereon, attaching the plurality of light-emitting components onto the first temporary substrate through the first adhesion film, removing the carrier from the plurality of light-emitting components, providing a second temporary substrate with a second adhesion film thereon, attaching the plurality of light-emitting components onto the second temporary substrate through the second adhesion film, removing the first adhesion film and the first temporary substrate from the plurality of light-emitting components, bonding the plurality of light-emitting components onto a thin-film transistor substrate, removing the second temporary substrate from the second adhesion film, and removing the second adhesion film from the plurality of light-emitting components.

Some embodiments of the disclosure provide a method for forming a display device. The method includes providing a first temporary substrate with a first plurality of light-emitting components thereon, and providing a first transfer substrate with a first plurality of adhesive pads thereon. A pitch of the first plurality of adhesive pads is an integer multiple of a pitch of the first plurality of light-emitting components on the first temporary substrate. The method also includes attaching a first group of the first plurality of light-emitting components onto a first group of the first plurality of adhesive pads on the first transfer substrate, removing the first temporary substrate while leaving the first group of the first plurality of light-emitting components on the first transfer substrate, attaching a second group of the first plurality of light-emitting components onto a second group of the first plurality of adhesive pads on the first transfer substrate, removing the first temporary substrate while leaving the second group of the first plurality of light-emitting components on the first transfer substrate, and bonding the first group and the second group of the first plurality of light-emitting components onto a thin-film transistor substrate.

Some embodiments of the disclosure provide a light-emitting structure. The light-emitting structure includes a light-emitting component and a protection layer partially surrounding the light-emitting component. The protection layer includes an organic sub-layer and an inorganic sub-layer A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that in accordance with standard practice in the industry, various features are not drawn to scale. In fact, the dimensions of the various features may be arbitrarily increased or reduced for clarity of discussion.

FIGS. 5A, 5B, 5C, 5D, 5E, 5F, 5G, 5H, 5I, 5J, 5K, and 5L are a series of cross-sectional views illustrating a method for forming a display device according to some embodiments of the present disclosure.

DETAILED DESCRIPTION

Figure 1A:
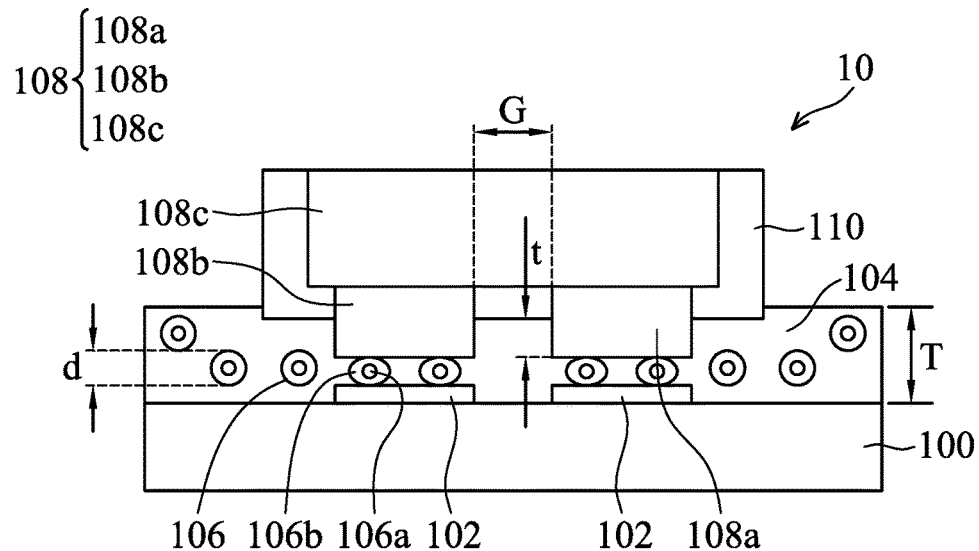
FIGS. 1A, 1B, 1C, 1D, 1E, 1F, 1G and 1H are cross-sectional views of some display devices according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various embodiments. This repetition is for simplicity and clarity and does not in itself dictate a relationship between the various embodiments and/or configurations discussed.

Some embodiments are described below. Throughout the various views and illustrative embodiments, like reference numbers are used to designate like features. It should be understood that additional operations can be provided before, during, and after the method, and some of the operations described can be replaced or eliminated for other embodiments of the method.

[Embodiment 1]

Embodiment 1 provides a display device with a protection layer surrounding a light-emitting component. The protection layer may provide the display device with advantages, such as better reliability.

FIG. 1A illustrates a display device 10 of Embodiment 1. As shown in FIG. 1A, the display device 10 includes a substrate 100, one or more conductive pads 102 disposed on the substrate 100, an adhesion film 104 disposed on the conductive pad 102, one or more light-emitting components 108 disposed on the adhesion film 104, and a protection layer 110 partially surrounding the light-emitting component 108. The adhesion film 104 includes a plurality of conductive particles 106. The light-emitting component 108 includes a main portion 108c (e.g., a portion made of semiconductor material, such as GaN) and a connection feature, such as 108a and 108b. In some embodiments, the thickness of the connection feature 108a may be the same as the thickness of the connection feature 108b (as shown in FIG. 1A), but the thickness of the connection feature 108a may be different from the thickness of the connection feature 108b in other embodiments. The connection feature of the light-emitting component 108 has a lower portion not surrounded by the protection layer 110. The adhesion film 104 has a thickness of T, one of the plurality of conductive particles 106 of the adhesion film 104 has a diameter of d (e.g., the diameter of a conductive particle 106 which is not disposed between the connection feature 108a/108b and the conductive pad 102), and the lower portion of the connection feature (i.e., 108a and 108b) has a thickness of t. In some embodiments, the conductive particle 106 which is disposed between the connection feature 108a/108b and the conductive pad 102 is substantially oval (ellipse), while the conductive particle 106 which is not disposed between the connection feature 108a/108b and the conductive pad 102 is substantially round, as shown in FIG. 1A. In some embodiments, the diameter d of the round conductive particle 106 is greater than the minimum diameter of the oval conductive particle 106 and less than the maximum diameter of the oval conductive particle 106.

In some embodiments, the above parameters satisfy the equation $0<t\leq T-d$, so that the mechanical properties of the display device 10 can be improved (e.g., the bonding between the substrate 100 and the light-emitting component 108).

In some embodiments, the above parameters satisfy the equation $d\leq T\leq 3d$, so that the mechanical properties of the display device 10 can be improved (e.g., the bonding between the substrate 100 and the light-emitting component 108).

For example, the diameter d of one of the plurality of conductive particles 106 can be 3.4 um, the thickness T of the adhesion film 104 can be 4 um, and the thickness t of the lower portion of the connection feature can be 0.5 um.

The substrate 100 may include, for example, a thin-film transistor substrate. The thin-film transistor substrate may include one or more thin-film transistors, and the thin-film transistors may be arranged in an array.

The conductive pad 102 may be used to electrically connect the light-emitting component 108 to the substrate 100. For example, the conductive pad 102 may include metal, metal alloy, other applicable conductive materials, or a combination thereof.

For example, the adhesion film 104 may include an anisotropic conductive film (ACF), which contains a plurality of conductive particles 106 therein. In some embodiments, one of the plurality of conductive particles 106 has a diameter of d and may be made of metal, metal alloy, other applicable conductive materials, or a combination thereof. In some embodiments, as shown in FIG. 1A, the conductive particles 106 may have a core portion 106a and a shell portion 106b. For example, the core portion 106a may include a polymer, and the shell portion 106b may include metal or metal alloy coated on the core portion 106a.

For example, the light-emitting component 108 may include a light-emitting diode (lateral or vertical), an organic light-emitting diode, other applicable light-emitting components, or a combination thereof. In the present embodiment, the light-emitting component 108 is a lateral light-emitting diode, and the connection feature of the light-emitting component 108 includes a first bump (e.g., 108a) and a second bump (e.g., 108b) which may be used as electrodes of the light-emitting diode. As shown in FIG. 1A, the first bump (e.g., 108a) and the second bump (e.g., 108b) are spaced apart by a distance of G. In some embodiments, the diameter d of one of the plurality of conductive particles 106 may be equal or less than half of G (i.e., $d\leq G/2$), and thus may be able to avoid the short circuit of the connection feature 108a and the connection feature 108b. For example, the diameter d of one of the plurality of conductive particles 106 can be 3.4 um, and the distance G between the first bump and the second bump can be 10 um.

In the present embodiment, as shown in FIG. 1A, the protection layer 110 fills or partially fills the gap between the first bump (e.g., 108a) and the second bump (e.g., 108b), so that the reliability of the display device 10 may be improved.

In some embodiments, the lower portion of the connection feature of the light-emitting component 108 includes a first metal, the conductive pad 102 includes a second metal (e.g., an upper portion of the conductive pad 102), and the plurality of conductive particles 106 includes a third metal (e.g., the shell portion 106b of the conductive particle 106). In such cases, a solid solution or an intermetallic compound of the first metal and the third metal may be formed (e.g., by a eutectic reaction) between the lower portion of the connection feature of the light-emitting component 108 and the plurality of conductive particles 106, to further improve the bonding between the light-emitting component 108 and the plurality of conductive particles 106. Alternatively or additionally, a solid solution or an intermetallic compound of the second metal and the third metal may be formed (e.g., by a eutectic reaction) between the conductive pad 102 and the plurality of conductive particles 106, and thus the bonding between the conductive pad 102 and the plurality of conductive particles 106 may be improved.

In some embodiments, the third metal may include a metal or metal alloy applicable for eutectic bonding (e.g., Sn, Ag, In, Cu, Au, Ni, Pd, Cr, Al, Ti, or a combination thereof), and the first metal and the second metal may respectively include a metal or metal alloy with a low melting point (e.g., Sn, Ag, In, Cu, Au, Zn, Bi, Sb, or a combination thereof). In some other embodiments, the third metal may include a metal or metal alloy with a low melting point (e.g., Sn, Ag, In, Cu, Au, Zn, Bi, Sb, or a combination thereof), and the first metal and the second metal may respectively include Sn, Ag, In, Cu, Au, Zn, Bi, Sb, Ni, Pd, Cr, Al, Ti, or a combination thereof (i.e., metal or metal alloy applicable for eutectic bonding and/or metal or metal alloy with a low melting point).

Figure 1B:
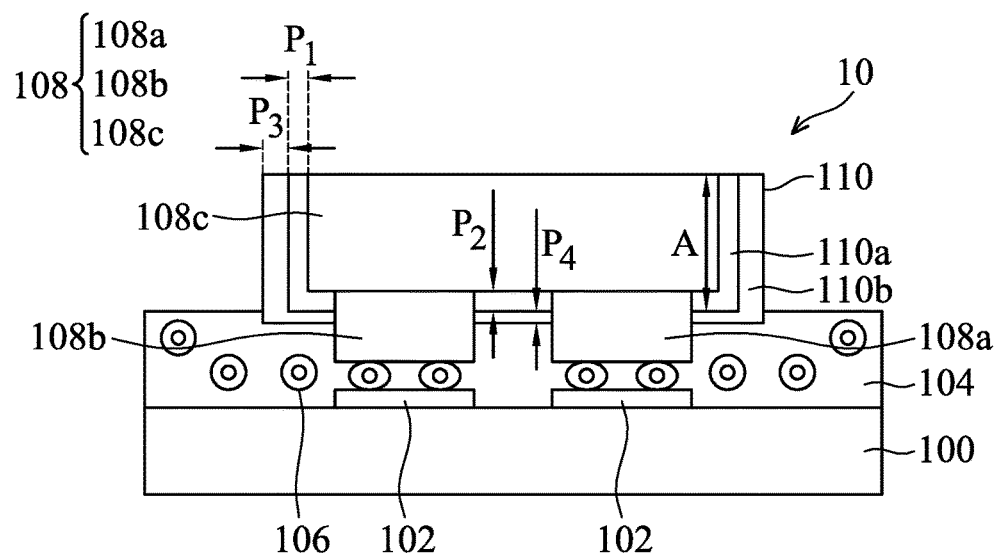

In some embodiments, as shown in FIG. 1B, the protection layer 110 may include an organic sub-layer 110a, and an inorganic sub-layer 110b surrounding the organic sub-layer 110a. In some embodiments, the inorganic sub-layer 110b is the outermost layer of the protection layer 110. For example, the organic sub-layer 110a may include silicon-based material, acrylic-based material, other applicable organic materials, or a combination thereof. In some embodiments, the inorganic sub-layer 110b may include silicon oxide, silicon nitride, other applicable inorganic materials, or a combination thereof, and may be formed by lithography process, ink jet, aerosol jet, other applicable processes, or a combination thereof. In some embodiments, the organic sub-layer 110a can be used to support the light-emitting component 108 and prevent the light-emitting component 108 from damage in a transferring process. In some embodiments, the inorganic sub-layer 110b may be used to change the surface properties of the protection layer 110. For example, a distance A between a top surface of the light-emitting component 108 and a bottom surface of the organic sub-layer 110a may be 1 µm to 100 µm. For example, a thickness $P_1$ of the organic sub-layer 110a on the sidewall of the light-emitting component 108 may be 0.1 µm to 5 µm, and a thickness $P_2$ of the organic sub-layer 110a adjacent to the connection feature (e.g., 108a and 108b) of the light-emitting component 108 may be 0.1 µm to 10 µm. For example, a thickness $P_3$ of the inorganic sub-layer 110b on the sidewall of the light-emitting component 108 may be 0.1 µm to 5 µm, and a thickness $P_4$ of the inorganic sub-layer 110b adjacent to the connection feature (e.g., 108a and 108b) of the light-emitting component 108 may be 0.1 µm to 10 µm. It should be noted that the inorganic sub-layer 110b may also be a multi-layered structure including two or more layers of inorganic material, such as SiNx/SiOx, SiOx/SiNx, SiN/Mo, or a combination thereof.

FIGS. 1C, 1D, 1E, 1F, 1G and 1H are some other embodiments of display devices with a protection layer including one or more organic sub-layers and inorganic sub-layers.

Figure 1C:
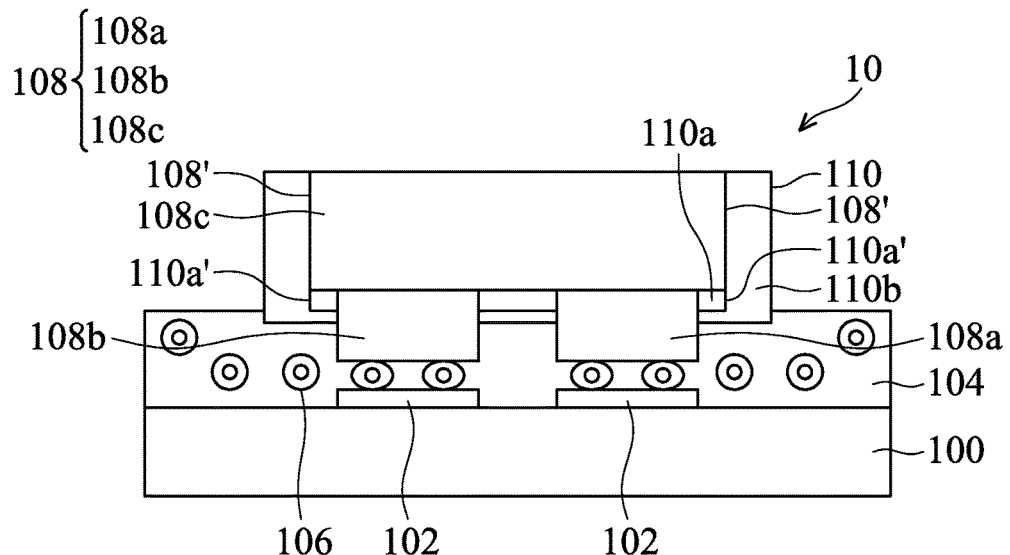

As shown in FIG. 1C, outermost sidewalls 110a' of the organic sub-layer 110a may be aligned with outermost sidewalls 108' of the light-emitting component 108.

Figure 1D:
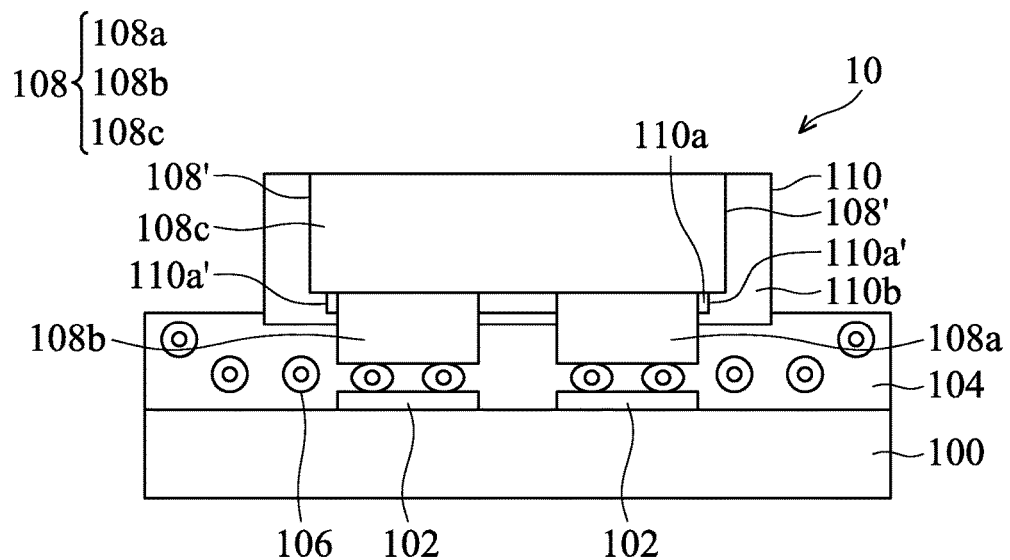

As shown in FIG. 1D, outermost sidewalls 110a' of the organic sub-layer 110a may retract from the outermost sidewalls 108' of the light-emitting component 108.

Figure 1E:
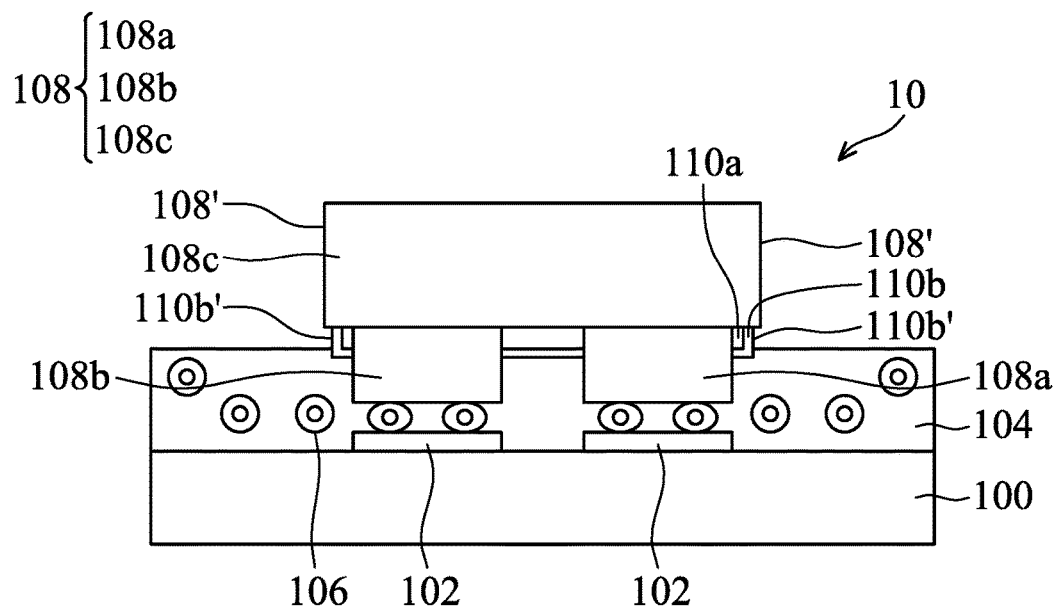

As shown in FIG. 1E, outermost sidewalls 110b' of the inorganic sub-layer 110b may also retract from the outermost sidewalls 108' of the light-emitting component 108.

Figure 1F:
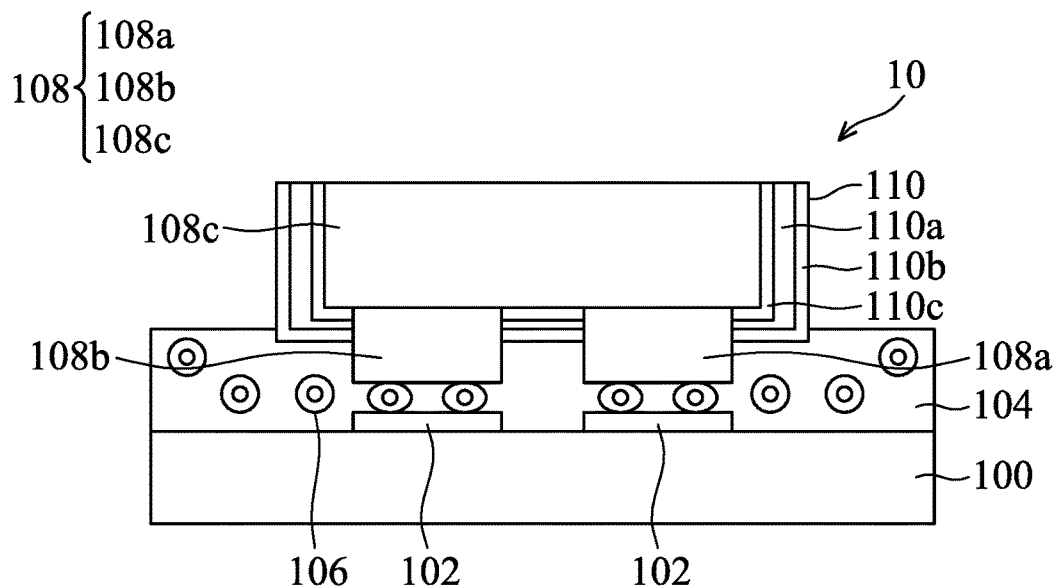

As shown in FIG. 1F, the protection layer 110 may further include an innermost inorganic sub-layer 110c, such that the organic sub-layer 110a is interposed between the outermost inorganic sub-layer 110b and the innermost inorganic sub-layer 110c.

Figure 1G:
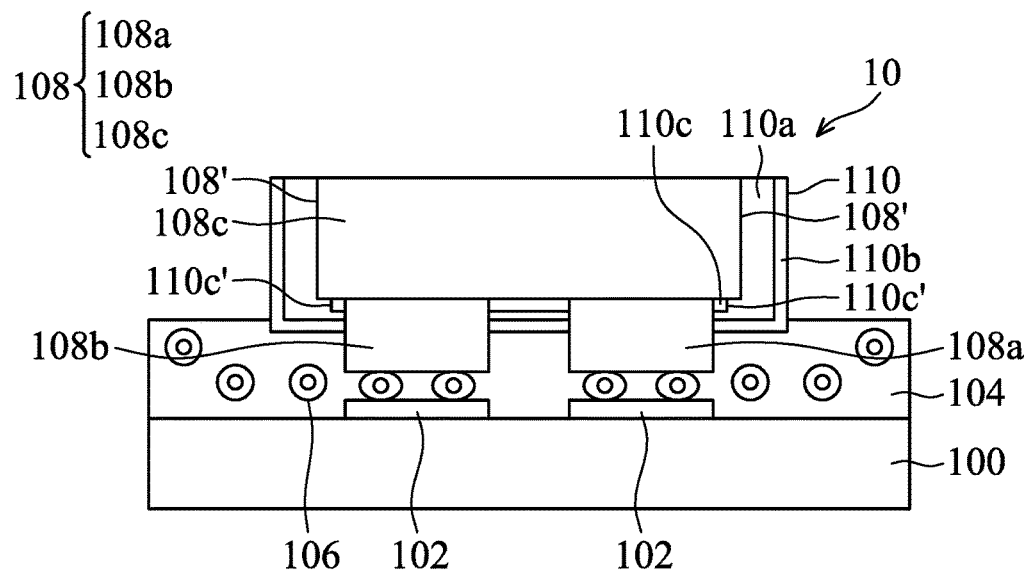

As shown in FIG. 1G, outermost sidewalls 110c' of the inorganic sub-layer 110c may retract from the outermost sidewalls 108' of the light-emitting component 108.

In some embodiments the outermost sidewalls 110a' of the organic sub-layer 110a, the outermost sidewalls 110b' of the inorganic sub-layer 110b, and the outermost sidewalls 110c' of the inorganic sub-layer 110c are substantially perpendicular to the top surface of the substrate 100 (as shown in FIGS. 1B-1G). In some embodiments, the angle between the outermost sidewalls 110a' of the organic sub-layer 110a and the top surface of the substrate 100 may be greater than zero and less than π, and/or the angle between the outermost sidewalls 110b' of the inorganic sub-layer 110b and the top surface of the substrate 100 may be greater than zero and less than π, and/or the angle between the outermost sidewalls 110c' of the inorganic sub-layer 110c and the top surface of the substrate 100 may be greater than zero and less than π.

Figure 1H:
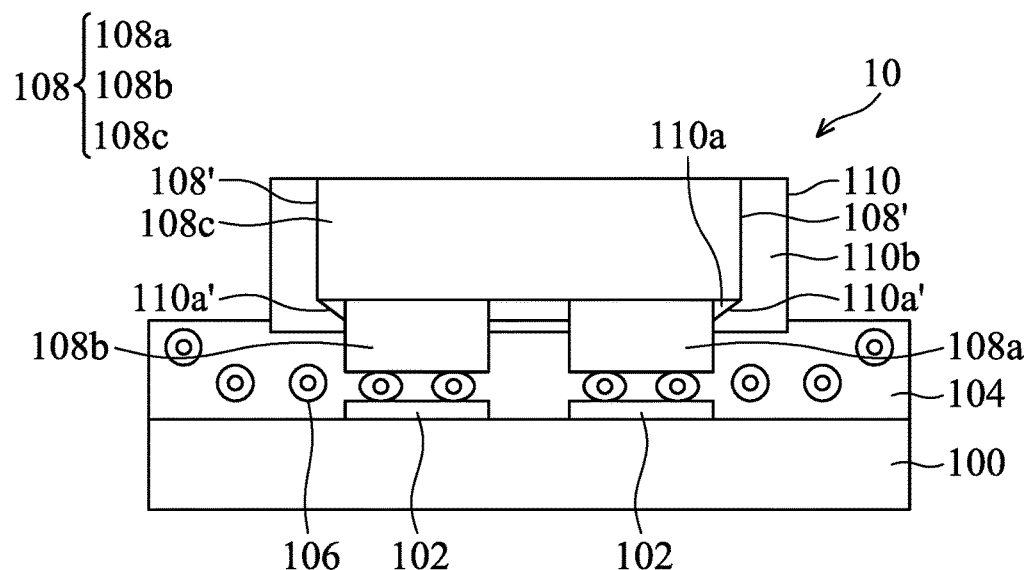

In some embodiments, at least one of the outermost sidewalls of the sub-layers of the protection layer 110 can taper inwardly in a direction towards the substrate 100. For example, as shown in FIG. 1H, the outermost sidewalls 110a' of the organic sub-layer 110a taper inwardly in a direction towards the substrate 100.

In some embodiments, the outermost sidewalls 110a' of the organic sub-layer 110a, the outermost sidewalls 110b' of the inorganic sub-layer 110b, and the outermost sidewalls 110c' of the inorganic sub-layer 110c are substantially straight (as shown in FIGS. 1B-1G). In other embodiments, at least one of the outermost sidewalls 110a' of the organic sub-layer 110a, the outermost sidewalls 110b' of the inorganic sub-layer 110b, and the outermost sidewalls 110c' of the inorganic sub-layer 110c may be curved.

Although not shown in the above figures, it should be noted that some additional elements such as a cover plate or an optical film may be formed on the display devices of the above embodiments. For example, the cover plate may be made of glass, indium tin oxide, polyimide, polyethylene terephthalate, other applicable materials, or a combination thereof. For example, the optical film may include a diffuser film, a condensing lens, other applicable optical films, or a combination thereof.

It should be noted that the light-emitting structure which includes the light-emitting component 108 and the protection layer 110 as illustrated in FIGS. 1A-1H are intended to be included within the scope of the present disclosure, and can be used in other embodiments of the preset disclosure (e.g., Embodiments 2-6).

[Embodiment 2]

Embodiment 2 provides a method for forming display devices of the above embodiments.

Figure 2A:
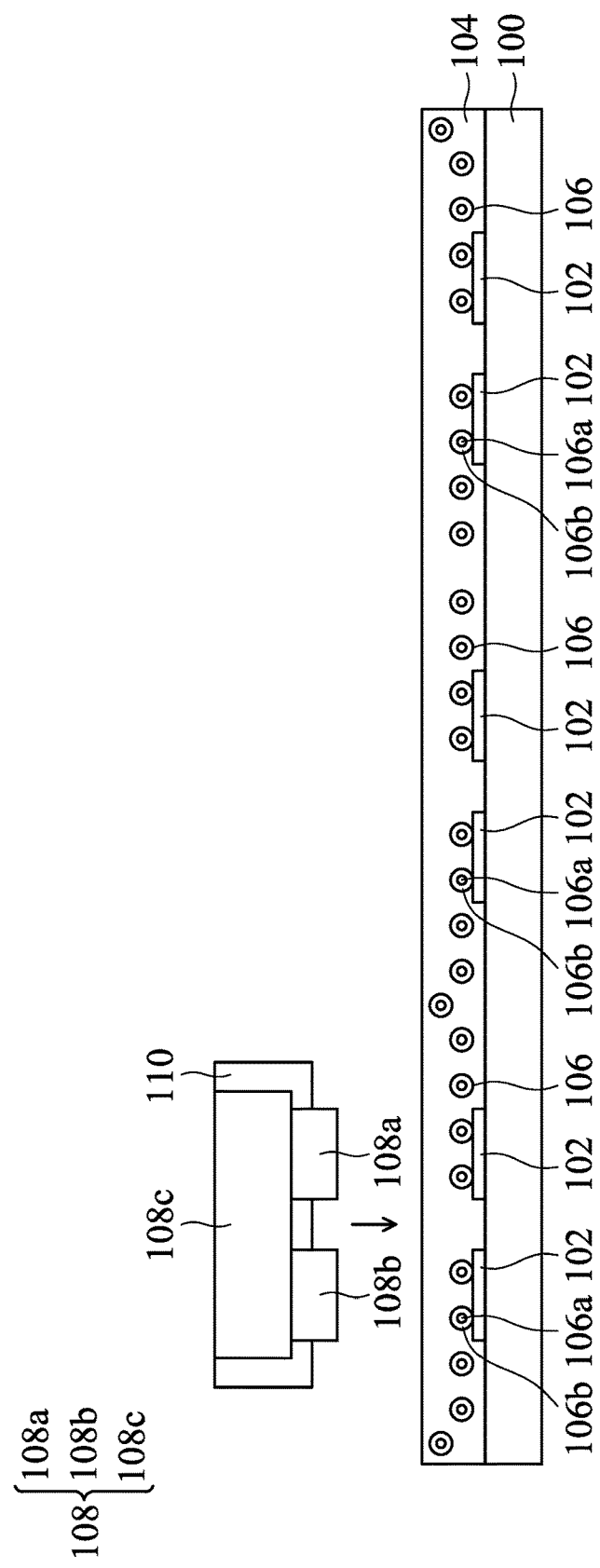
FIGS. 2A, 2B and 2C are a series of cross-sectional views illustrating a method for forming a display device according to some embodiments of the present disclosure.

First, as shown in FIG. 2A, the light-emitting component 108 including a connection feature (e.g., 108a and 108b) is provided. The light-emitting component 108 is surrounded or partially surrounded by the protection layer 110.

Then, as shown in FIG. 2A, the substrate 100 (e.g., a thin-film transistor substrate) with one or more conductive pads 102 formed thereon is provided. As shown in FIG. 2A, the adhesion film 104 containing a plurality of conductive particles 106 is formed on the substrate 100 and the conductive pad 102. For example, the conductive particles 106 are randomly distributed in the adhesion film 104. For example, a spin-on coating or other applicable method can be used to form the adhesion film 104 on the substrate 100 and the conductive pad 102.

Figure 2B:
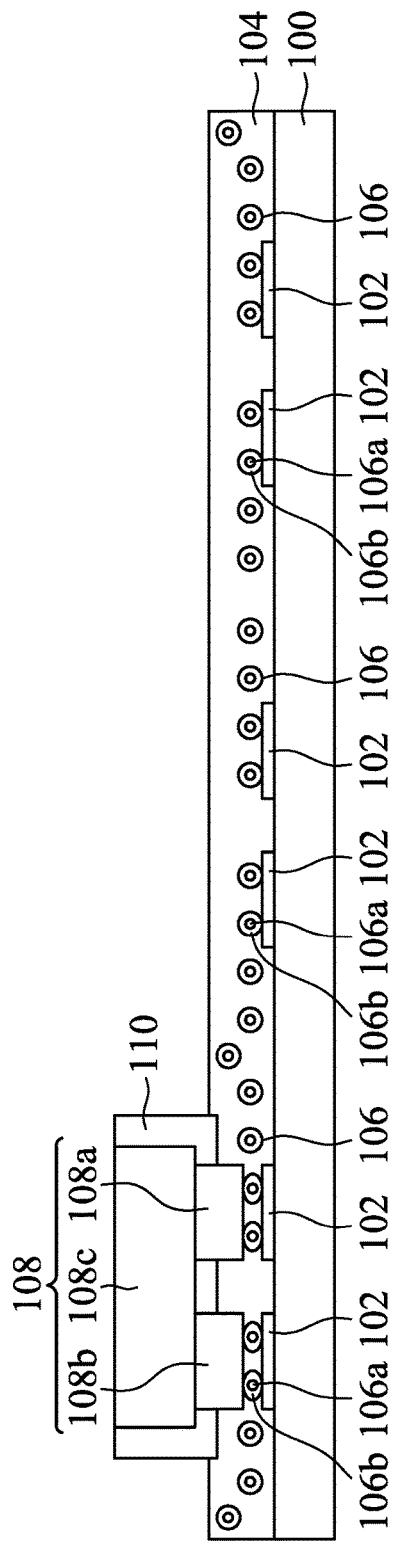

Then, as shown in FIG. 2B, the light-emitting component 108 and the substrate 100 are bonded by a bonding process. For example, the bonding process may include a eutectic bonding process. As noted above, the lower portion of the connection feature (e.g., 108a and 108b) of the light-emitting component 108 may include a first metal, the conductive pad 102 may include a second metal (e.g., an upper portion of the conductive pad 102), and the plurality of conductive particles 106 may include a third metal (e.g., the shell portion 106b of the conductive particle 106). Therefore, a solid solution or an intermetallic compound of the first metal and the third metal may be formed between the lower portion of the connection feature of the light-emitting component 108 and the plurality of conductive particles 106 by the eutectic bonding process, and a solid solution or an intermetallic compound of the second metal and the third metal may be formed between the conductive pad 102 and the plurality of conductive particles 106 by the eutectic bonding process.

Then, a curing process may be performed to cure the adhesion film 104. In some embodiments, the adhesion film 104 may be cured by an ultraviolet light. In some other embodiments, the adhesion film 104 may be thermally cured at a temperature higher than (e.g., 50° C. higher than) the eutectic reaction temperature of the first metal and the third metal and/or higher than (e.g., 50° C. higher than) the eutectic reaction temperature of the second metal and the third metal. Since the adhesion film 104 may be cured by an ultraviolet light or may be cured at a temperature higher than the eutectic reaction temperature of the eutectic bonding process, the adhesion film 104 remains uncured after being subject to the bonding process (e.g., eutectic bonding process). Therefore, if the light-emitting component 108 is abnormal after the bonding process, it still can be removed or replaced with another light-emitting component.

Figure 2C:
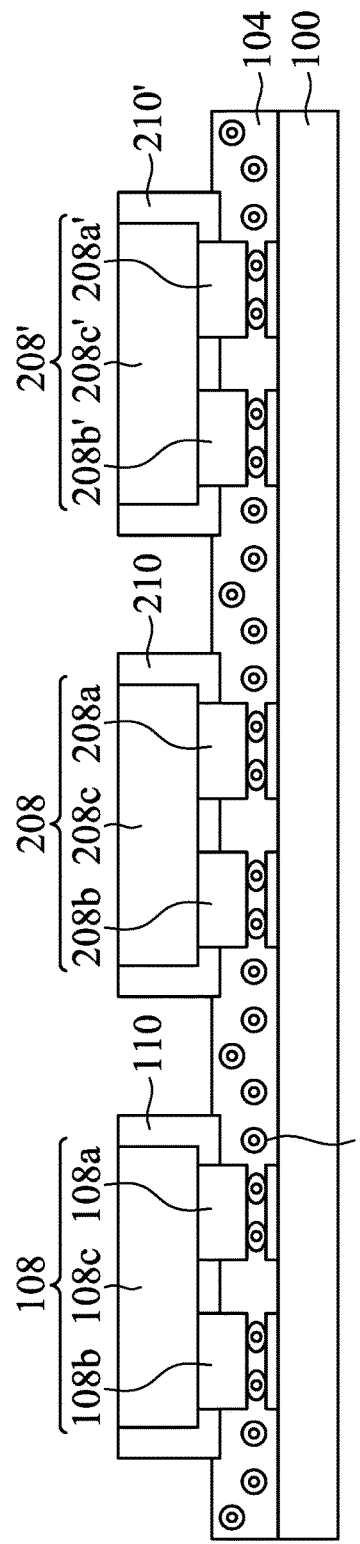

In some embodiments, as shown in FIG. 2C, a plurality of light-emitting components can be bonded to the substrate 100 using the above method. For example, after the step of bonding the light-emitting component 108 to the substrate 100, and before the step of curing the adhesion film 104, a light-emitting component 208 surrounded by a protection layer 210 and a light-emitting component 208' surrounded by a protection layer 210' may be also bonded to the substrate 100. The light-emitting component 108, the light-emitting component 208, and the light-emitting component 208' may be light-emitting diodes of different colors. For example, the light-emitting component 108 may be a blue light-emitting diode, the light-emitting component 208 may be a green light-emitting diode, and the light-emitting component 208' may be a red light-emitting diode.

In the present embodiment, the adhesion film 104 is formed on the substrate 100 before the bonding process. However, in some other embodiments, the adhesion film 104 can be formed on the connection feature of the light-emitting component (e.g., light-emitting component 108, 208, or 208') before the bonding process.

Although not shown in the above figures, it should be noted that some additional elements such as a cover plate or an optical film may also be formed on the substrate 100 to protect the display device or improve its performance.

[Embodiment 3]

Embodiment 3 provides a method for forming a display device by transferring a plurality of light-emitting components to a substrate (e.g., thin-film transistor substrate).

Figure 3A:
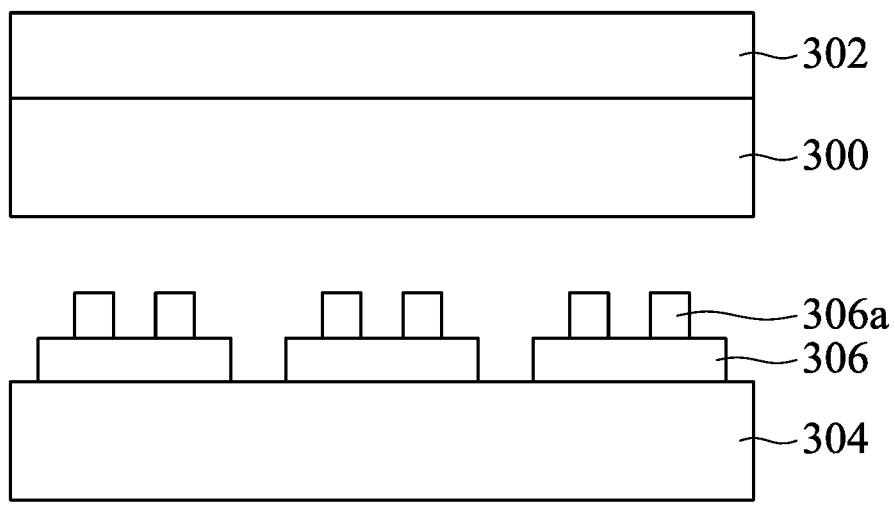
FIGS. 3A, 3B, 3C, 3D, 3E, 3F, 3G, 3H, and 3I are a series of cross-sectional views illustrating a method for forming a display device according to some embodiments of the present disclosure.

First, as shown in FIG. 3A, a first temporary substrate 300 with a first adhesion film 302 thereon is provided. For example, the first temporary substrate 300 may be made of glass, polyimide, polyethylene terephthalate, other applicable materials, or a combination thereof. For example, the first adhesion film 302 may include a UV-light debondable adhesion film, a heat debondable adhesion film, other applicable adhesion films, or a combination thereof. In some embodiments, the first adhesion film 302 may be a glue, a tape, or a combination thereof. For example, a spin-on coating or other applicable methods can be used to form the first adhesion film 302 on the first temporary substrate 300. In some embodiments, the first adhesion film 302 may be a patterned adhesion film formed by a lithography process, ink jet, aerosol jet, other applicable processes, or a combination thereof.

Still referring to FIG. 3A, a carrier 304 with a plurality of light-emitting components 306 formed thereon is provided. For example, the carrier 304 may include a sapphire substrate, a silicon substrate, a silicon carbide substrate, other applicable carriers, or a combination thereof. In some embodiments, the light-emitting components 306 may include a light-emitting diode (lateral or vertical), an organic light-emitting diode, other applicable light-emitting components, or a combination thereof. In the present embodiment, the light-emitting component 306 is a light-emitting diode including a connection feature 306a (e.g., a bump or electrode of the light-emitting diode). In some embodiments, at least one of the light-emitting components 306 on the carrier is partially surrounded by a protection layer (e.g., the protection layer 110 shown in FIGS. 1B-1H).

Figure 3B:
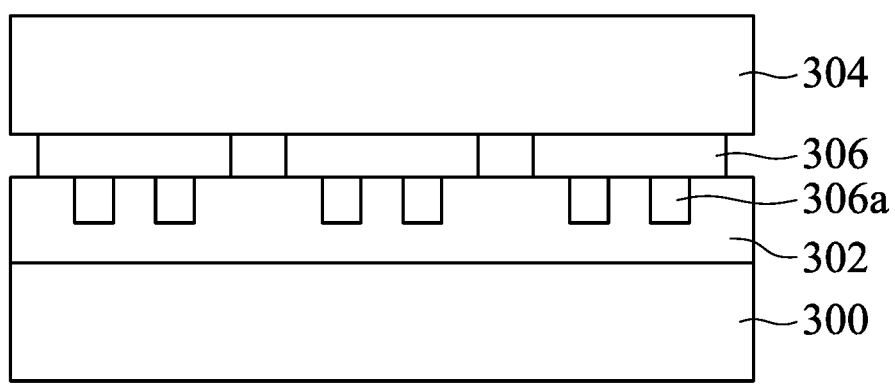

Then, as shown in FIG. 3B, the plurality of light-emitting components 306 are attached onto the first temporary substrate 300 through the first adhesion film 302. As shown in FIG. 3B, the connection feature 306a of the light-emitting component 306 extends into an upper portion of the first adhesion film 302.

Figure 3C:
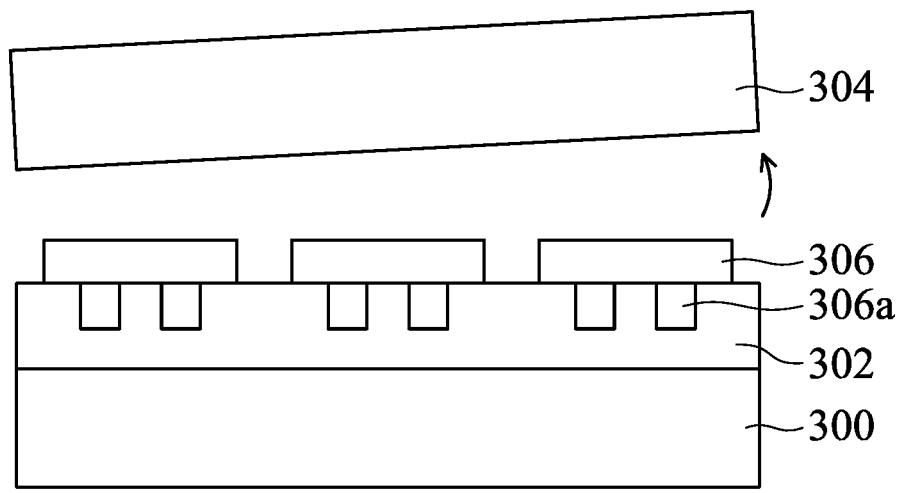

Then, as shown in FIG. 3C, the carrier 304 is removed from the plurality of light-emitting components 306. For example, the carrier 304 can be removed by a laser lift-off process, a mechanical peeling, other applicable processes, or a combination thereof. For example, the laser source of the laser lift-off process may include an excimer laser, a pico laser, a femto laser, other applicable laser sources, or a combination thereof.

Figure 3D:
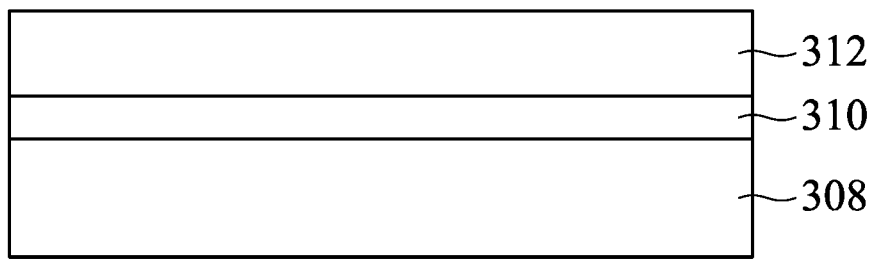

Then, as shown in FIG. 3D, a second temporary substrate 308 with a light-responsive layer 310 thereon is provided. For example, the second temporary substrate 308 may be made of glass, polyimide, polyethylene terephthalate, other applicable materials, or a combination thereof. For example, the light-responsive layer 310 may include glue, and particles disposed in the glue. In some embodiments, the particles of the light-responsive layer 310 can be expanded by a heating process (e.g., a laser heating process). For example, the light-responsive layer 310 may be formed on the second temporary substrate 308 by a spin-on coating process, other applicable processes, or a combination thereof.

Still referring to FIG. 3D, a second adhesion film 312 is formed on the light-responsive layer 310 on the second temporary substrate 308. For example, the second adhesion film 312 may include a UV-light debondable adhesion film, a heat debondable adhesion film, other applicable adhesion films, or a combination thereof. In some embodiments, the second adhesion film 312 may be a glue, a tape, or a combination thereof. For example, a spin-on coating or other applicable methods can be used to form the second adhesion film 312 on the light-responsive layer 310 on the second temporary substrate 312. In some embodiments, the second adhesion film 312 may be a patterned adhesion film formed by a lithography process, ink jet, aerosol jet, other applicable processes, or a combination thereof. In some embodiments, the second adhesion film 312 is a patterned adhesion film including a plurality of adhesive pads (e.g., glue dots), and a pitch of the plurality of adhesive pads (e.g., the distance between the center lines of two adjacent adhesive pads) is an integer multiple of a pitch of the plurality of light-emitting components 306 (e.g., the distance between the center lines of two adjacent light-emitting components 306) on the first temporary substrate 300. In some embodiments, the second adhesion film 312 may be directly formed on the second temporary substrate 308 (i.e., without forming the light-responsive layer 310 on the second temporary substrate 308), and/or the second adhesion film 312 may be a single-layered or multi-layered structure.

In some embodiments, the first adhesion film 302 on the first temporary substrate 300 can be debonded by a UV-light of a first wavelength, and the second adhesion film 312 on the second temporary substrate 308 can be debonded by a UV-light of a second wavelength that is different from the first wavelength. In some other embodiments, one of the first adhesion film 302 and the second adhesion film 312 is a UV-light debondable film, and the other one of the first adhesion film 302 and the second adhesion film 312 is a heat debondable film.

Figure 3E:
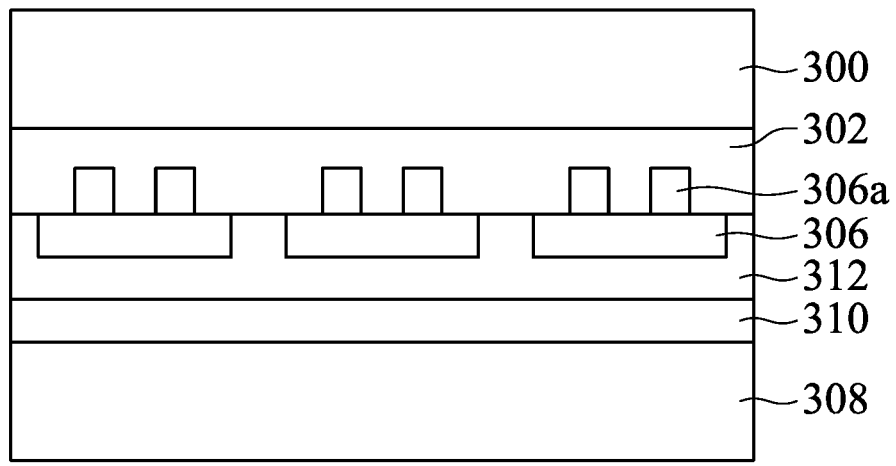

Then, as shown in FIG. 3E, the plurality of light-emitting components 306 are attached onto the second temporary substrate 308 through the second adhesion film 312, such that the first adhesion film 302 and the second adhesion film 312 are on opposite sides of the light-emitting components 306.

Figure 3F:
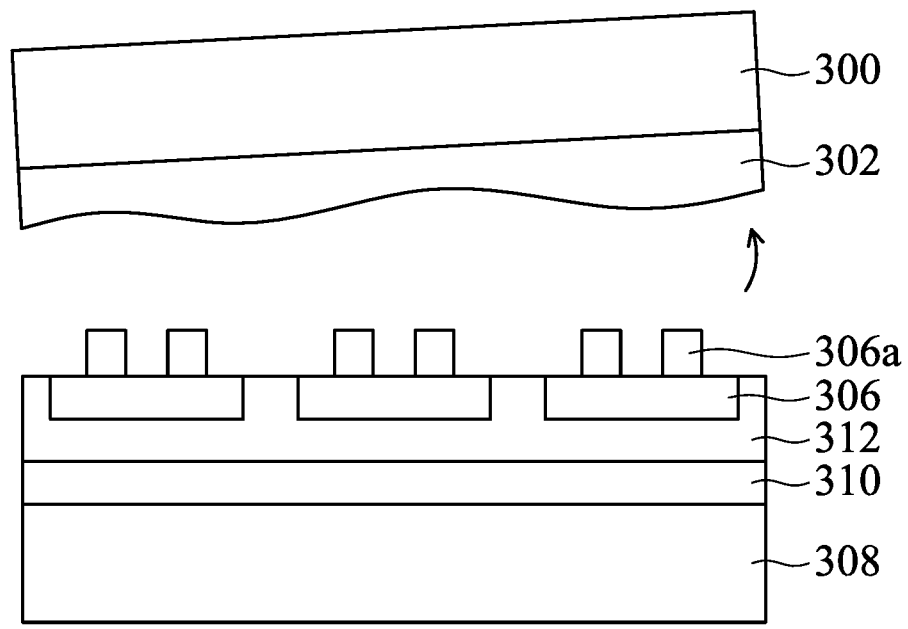

Then, as shown in FIG. 3F, the first adhesion film 302 and the first temporary substrate 300 are removed from the plurality of light-emitting components 306 by a removal process. For example, the removal process may include heating the first adhesion film 302 or exposing the first adhesion film 302 to a UV-light to debond the first adhesion film 302. In addition, a mechanical peeling may be performed after heating the first adhesion film 302 or exposing the first adhesion film 302 to the UV-light.

In some embodiments, the first adhesion film 302 can be debonded by the UV-light of the first wavelength, and the second adhesion film 312 can be debonded by the UV-light of the second wavelength that is different from the first wavelength. In such embodiments, the first adhesion film 302 can be debonded by exposing the first adhesion film 302 to the UV-light of the first wavelength, while leaving the second adhesion film 312 substantially undisturbed.

In some other embodiments, one of the first adhesion film 302 and the second adhesion film 312 is a UV-light debondable film, and the other one of the first adhesion film and the second adhesion film is a heat debondable film. In such embodiments, since the first adhesion film 302 and the second adhesion film 312 can be debonded by different mechanisms, the first adhesion film 302 can be debonded while leaving the second adhesion film 312 substantially undisturbed.

Figure 3G:
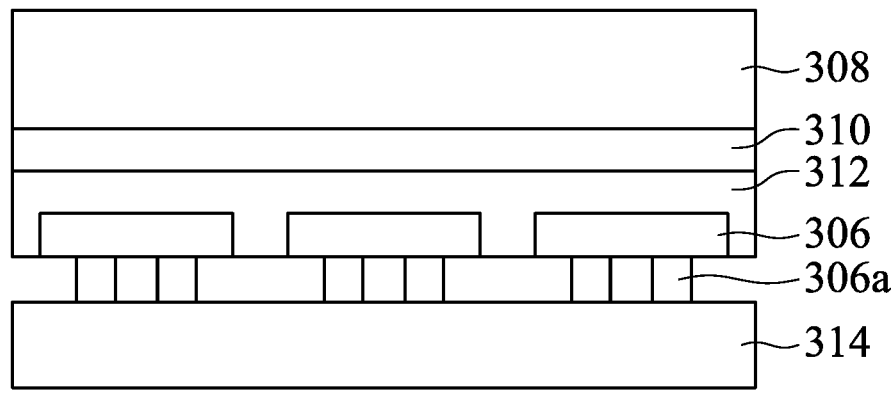

Then, as shown in FIG. 3G, the plurality of light-emitting components 306 are bonded onto a substrate 314 (e.g., thin-film transistor substrate). In some embodiments, the substrate 314 has one or more conductive pads and an adhesion film (e.g., anisotropic conductive film) formed thereon (not shown), and the plurality of light-emitting components 306 may be bonded to the substrate 314 through the adhesion film and the conductive pads by the eutectic bonding process discussed in the above embodiments. In some embodiments, a filler layer (not shown) may be formed on the substrate 314 before the plurality of light-emitting components 306 are bonded onto the substrate 314, so that the gap between adjacent light-emitting components 306 can be filled by the filler layer.

Figure 3H:
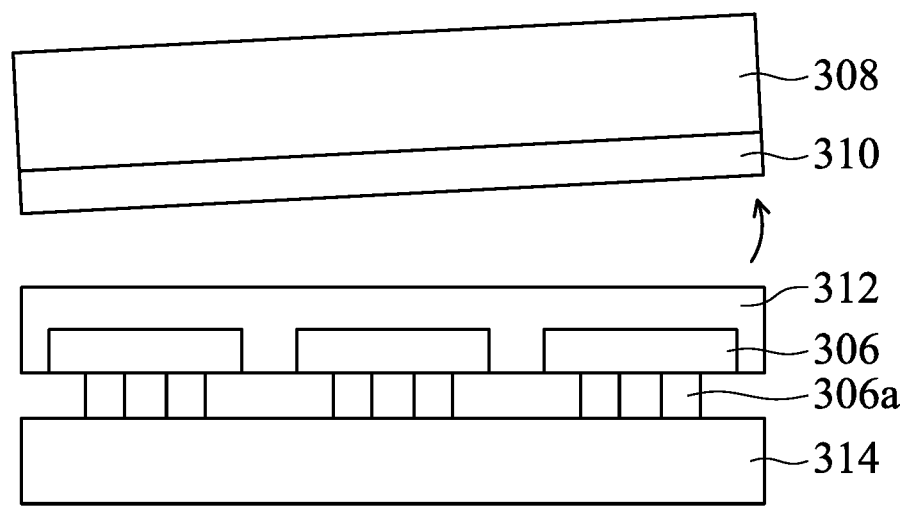

Then, as shown in FIG. 3H, the second temporary substrate 308, and the light-responsive layer 310 are removed from the second adhesion film 312. As noted above, in some embodiments, the light-responsive layer 310 includes particles being able to expand due to a heating process (e.g., a laser heating process), and the expanded particles may be advantageous for removing the second temporary substrate 308 and the light-responsive layer 310 from the second adhesion film 312. Therefore, the step of removing the second temporary substrate 308 and the light-responsive layer 310 from the second adhesion film 312 may include using a laser heating process to heat the particles of the light-responsive layer 310 in some embodiments. In some embodiments, a mechanical peeling may be performed after the heating process. In some embodiments, the second adhesion film 312 is directly formed on the second temporary substrate 308 (i.e., without forming the light-responsive layer 310 on the second temporary substrate 308), and thus only the second temporary substrate 308 are removed from the second adhesion film 312.

Figure 3I:
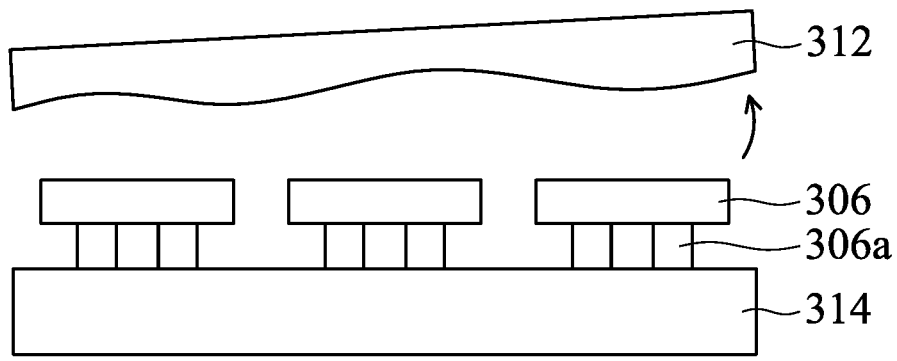

Then, as shown in FIG. 3I, the second adhesion film 312 is removed from the plurality of light-emitting components 306 by a removal process. In some embodiments, the removal process may include heating the second adhesion film 312 or exposing the second adhesion film 312 to a UV-light (e.g., a UV-light of the second wavelength) to debond the second adhesion film 312. In addition, a mechanical peeling may be performed after heating the second adhesion film 312 or exposing the second adhesion film 312 to the UV-light. In some embodiments, since the second adhesion film 312 is heated or exposed to the UV light after the second temporary substrate 308 is removed, the debonding of the second adhesion film 312 can be improved.

In some embodiments, the debonding of the second adhesion film 312 can be selective (i.e., a portion of the second adhesion film 312 is selectively debonded and another portion of the second adhesion film 312 is not debonded). For example, portions of the second adhesion film 312 which correspond to abnormal light-emitting components are not debonded (e.g., not exposed to the UV-light or not heated), and portions of the second adhesion film 312 which correspond to applicable light-emitting components are selectively debonded, such that the abnormal light-emitting components can be removed with the second adhesion film 312 while leaving the applicable light-emitting components on the substrate 314 (e.g., thin-film transistor substrate).

In some embodiments, both the light-responsive layer 310 and the second adhesion film 312 can be debonded by heat. For example, the process of removing the second adhesion film 312 can include heating the second adhesion film 312 at a first temperature (e.g., the minimum temperature to debond the second adhesion film 312), and the process of removing the light-responsive layer 310 can include heating the light-responsive layer 310 at a second temperature (e.g., the minimum temperature to debond the light-responsive layer 310) less than the first temperature, such that the second adhesion film 312 are not debonded in the step of removing the light-responsive layer 310.

In some embodiments, the second adhesion film 312 can be debonded by the UV-light of the second wavelength, and the light-responsive layer 310 can be debonded by a UV-light of a third wavelength different from the second wavelength. In such embodiments, the light-responsive layer 310 can be debonded by exposing the light-responsive layer 310 to the UV-light of the third wavelength, while leaving the second adhesion film 312 substantially undisturbed.

In some embodiments, one of the light-responsive layer 310 and the second adhesion film 312 is a UV-light debondable film, and the other one of the light-responsive layer 310 and the second adhesion film 312 is a heat debondable film. In such embodiments, the light-responsive layer 310 can be debonded by the UV-light or heat, while leaving the second adhesion film 312 substantially undisturbed.

Although not shown in the above figures, it should be noted that some additional elements such as a cover plate or an optical film may also be formed on the substrate 314 to protect the display device or improve its performance.

[Embodiment 4]

Embodiment 4 also provides a method for forming a display device by transferring a plurality of light-emitting components to a substrate (e.g., thin-film transistor substrate). One difference between Embodiment 3 and Embodiment 4 is that the light-responsive layer of Embodiment 4 is formed on the light-emitting components on the carrier.

Figure 4A:
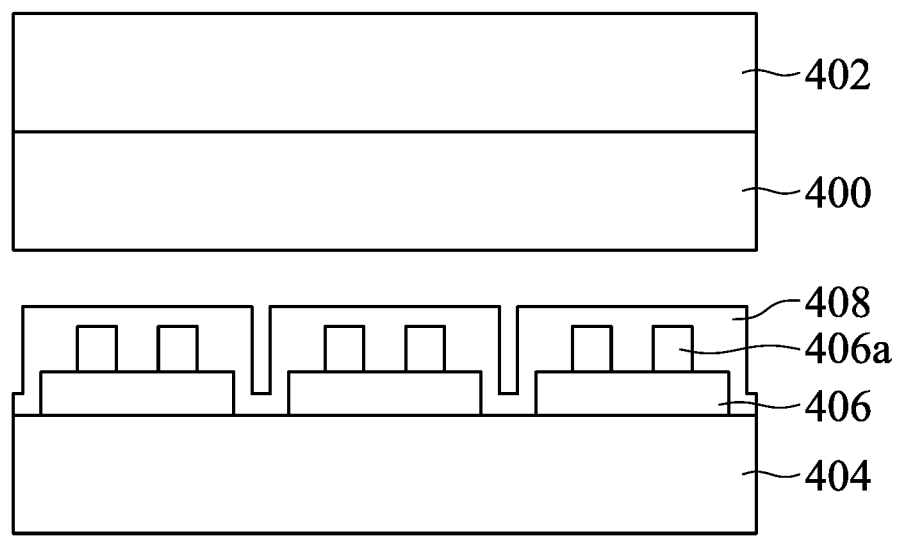
FIGS. 4A, 4B, 4C, 4D, 4E, 4F, 4G, 4H, and 4I are a series of cross-sectional views illustrating a method for forming a display device according to some embodiments of the present disclosure.

First, as shown in FIG. 4A, a first temporary substrate 400 with a first adhesion film 402 thereon is provided. For example, the first temporary substrate 400 may be made of glass, polyimide, polyethylene terephthalate, other applicable materials, or a combination thereof. For example, the first adhesion film 402 may include a UV-light debondable adhesion film, a heat debondable adhesion film, other applicable adhesion film, or a combination thereof. In some embodiments, the first adhesion film 402 may be a glue, a tape, or a combination thereof. For example, a spin-on coating or other applicable methods can be used to form the first adhesion film 402 on the first temporary substrate 400. In some embodiments, the first adhesion film 402 may be a patterned adhesion film formed by a lithography process, ink jet, aerosol jet, other applicable processes, or a combination thereof.

Still referring to FIG. 4A, a carrier 404 with a plurality of light-emitting components 406 formed thereon is provided. For example, the carrier 404 may include a sapphire substrate, a silicon substrate, a silicon carbide substrate, other applicable carrier, or a combination thereof. In some embodiments, the light-emitting components 406 may include a light-emitting diode (lateral or vertical), an organic light-emitting diode, other applicable light-emitting components, or a combination thereof. In the present embodiment, the light-emitting component 406 is a light-emitting diode including a connection feature 406a (e.g., a bump or electrode of the light-emitting diode).

As shown in FIG. 4A, a light-responsive layer 408 is formed on the carrier 404 and the plurality of light-emitting components 406 by an applicable process (e.g., a spin-on coating process). In some embodiments, the light-responsive layer 408 is conformally formed on the carrier 404 and the plurality of light-emitting components 406, as shown in FIG. 4A. For example, the light-responsive layer 408 may include glue, and particles disposed in the glue. In some embodiments, the particles of the light-responsive layer 408 can be expanded by a heating process (e.g., a laser heating process).

Figure 4B:
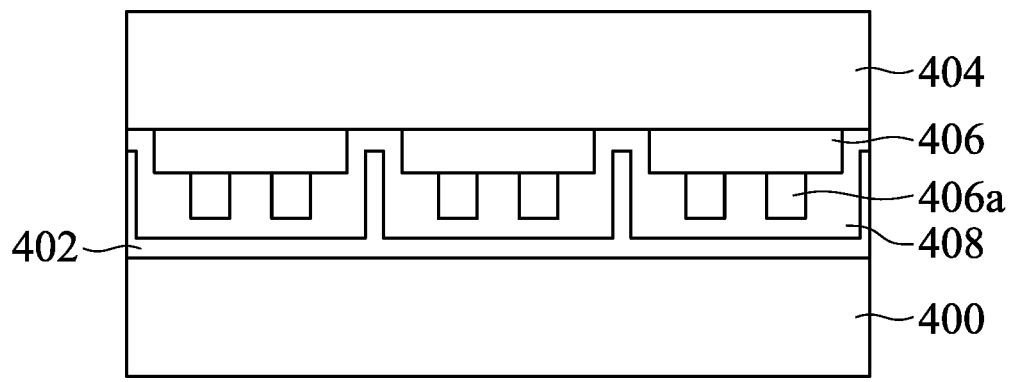

Then, as shown in FIG. 4B, the plurality of light-emitting components 406 are attached onto the first temporary substrate 400 through the first adhesion film 402. As shown in FIG. 4B, the connection feature 406a of the light-emitting component 406 extends into an upper portion of the first adhesion film 402.

Figure 4C:
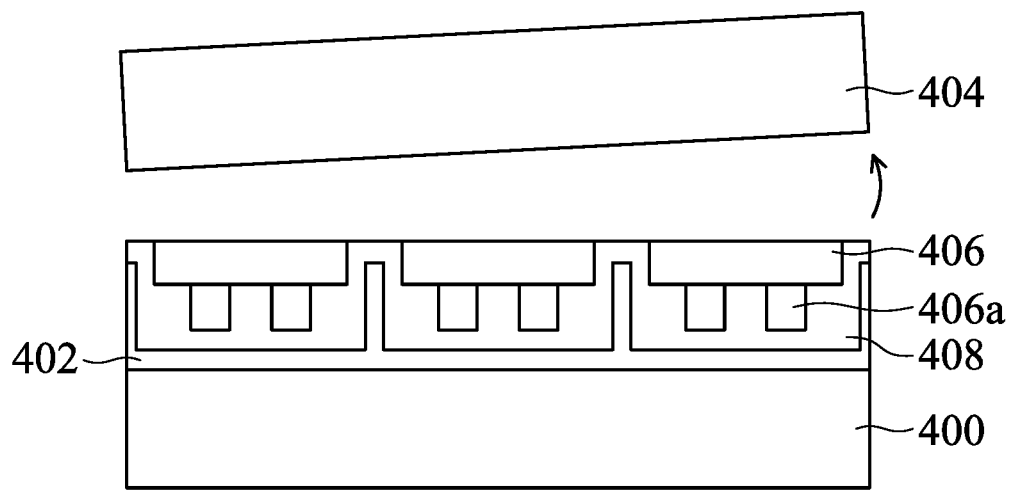

Then, as shown in FIG. 4C, the carrier 404 is removed from the plurality of light-emitting components 406. For example, the carrier 404 can be removed by a laser lift-off process, a mechanical peeling, other applicable processes, or a combination thereof. For example, the laser source of the laser lift-off process may include an excimer laser, a pico laser, a femto laser, other applicable laser sources, or a combination thereof.

Figure 4D:
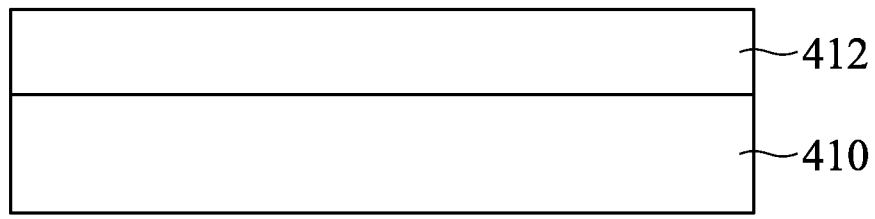

Then, as shown in FIG. 4D, a second temporary substrate 410 with a second adhesion film 412 thereon is provided. For example, the second temporary substrate 410 may be made of glass, polyimide, polyethylene terephthalate, other applicable materials, or a combination thereof. For example, the second adhesion film 412 may include a UV-light debondable adhesion film, a heat debondable adhesion film, other applicable adhesion films, or a combination thereof. In some embodiments, the second adhesion film 412 may be a glue, a tape, or a combination thereof. For example, a spin-on coating or other applicable methods can be used to form the second adhesion film 412 on the second temporary substrate 410. In some embodiments, the second adhesion film 412 may be a patterned adhesion film formed by a lithography process, ink jet, aerosol jet, other applicable processes, or a combination thereof.

Figure 4E:
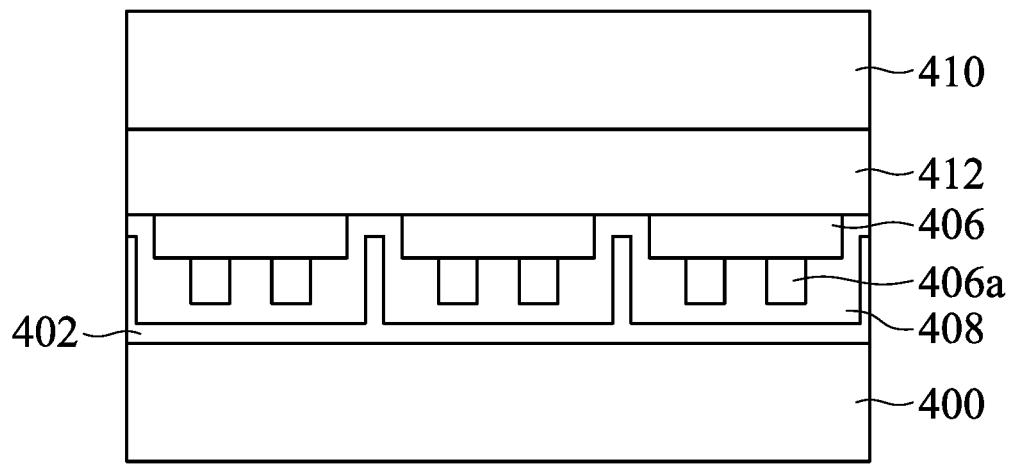

Then, as shown in FIG. 4E, the plurality of light-emitting components 406 are attached onto the second temporary substrate 410 through the second adhesion film 412, such that the first adhesion film 402 and the second adhesion film 412 are on opposite sides of the light-emitting components 406.

Figure 4F:
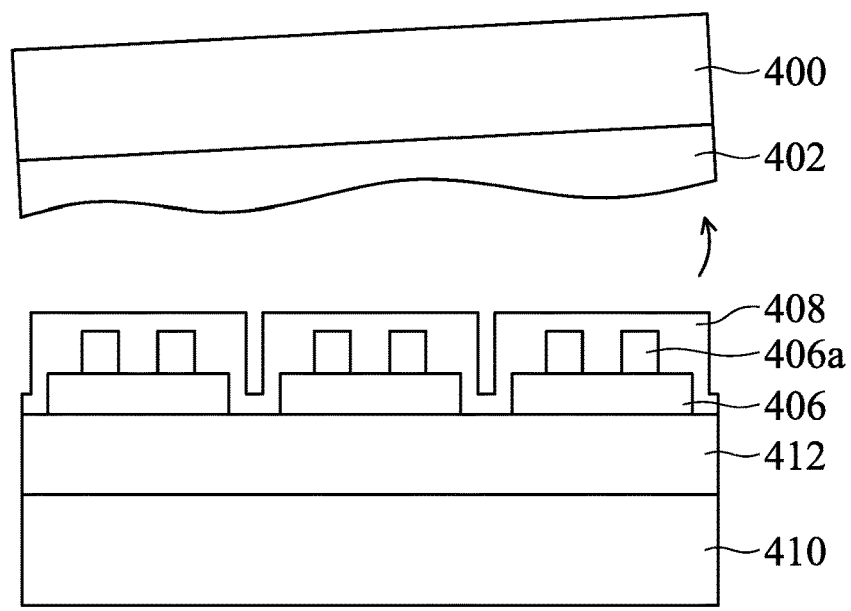

Then, as shown in FIG. 4F, the first adhesion film 402 and the first temporary substrate 400 are removed from the plurality of light-emitting components 406 by a removal process. As noted above, in some embodiments, the light-responsive layer 408 includes particles being able to expand due to a heating process (e.g., a laser heating process), and the expanded particles may be advantageous for removing the first adhesion film 402 and the first temporary substrate 400 from the plurality of light-emitting components 406. Therefore, the step of removing the first adhesion film 402 and the first temporary substrate 400 from the plurality of light-emitting components 406 may include using a laser heating process to heat the particles of the light-responsive layer 408 in some embodiments. In some embodiments, a mechanical peeling may be performed after the heating process.

Figure 4G:
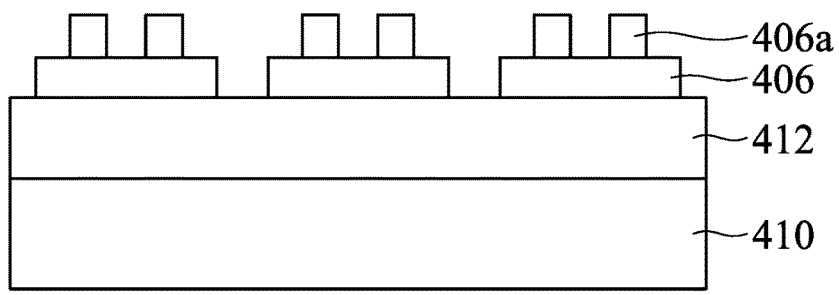

Then, as shown in FIG. 4G, the light-responsive layer 408 is removed from the plurality of light-emitting components 406. For example, the light-responsive layer 408 can be removed with an organic solution (e.g., Acetone, alcohol, or methyl), an inorganic solution (e.g., Silicone Oil), or a combination thereof.

Figure 4H:
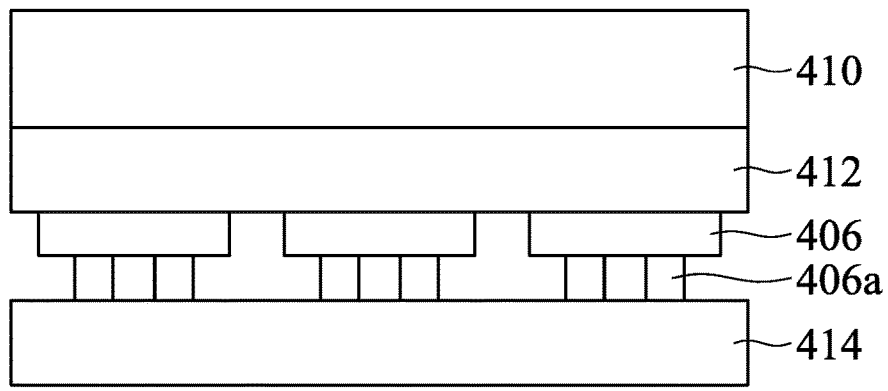

Then, as shown in FIG. 4H, the plurality of light-emitting components 406 are bonded onto a substrate 414 (e.g., thin-film transistor substrate). In some embodiments, the substrate 414 has one or more conductive pads and an adhesion film (e.g., anisotropic conductive film) formed thereon (not shown), and the plurality of light-emitting components 406 may be bonded to the substrate 414 through the adhesion film and the conductive pads by the eutectic bonding process discussed in the above embodiments. In some embodiments, a filler layer (not shown) may be formed on the substrate 414 before the plurality of light-emitting components 406 are bonded onto the substrate 414, so that the gap between adjacent light-emitting components 406 can be filled by the filler layer.

Figure 4I:
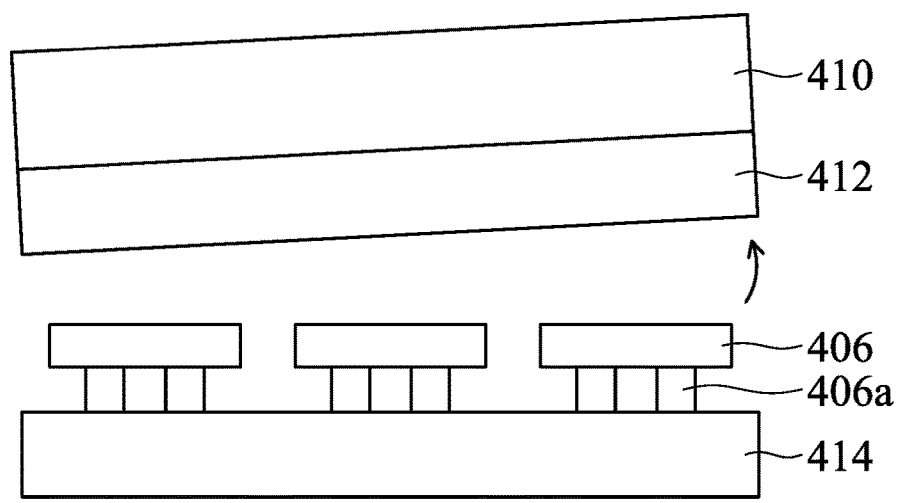

Then, as shown in FIG. 4I, the second adhesion film 412 and the second temporary substrate 410 are removed from the plurality of light-emitting components 406 by a removal process. For example, the removal process may include heating the second adhesion film 412 or exposing the second adhesion film 412 to a UV-light to debond the second adhesion film 412. In addition, a mechanical peeling may be performed after heating the second adhesion film 412 or exposing the second adhesion film 412 to the UV-light.

Although not shown in the above figures, it should be noted that some additional elements such as a cover plate or an optical film may also be formed on the substrate 414 to protect the display device or improve its performance.

It should be noted that, in some embodiments, the light-responsive layer 408 may be replaced with a release film. For example, the release film may contain halogens. In some embodiments, a surface treatment may be performed on the plurality of light-emitting components 406 before forming the release film on the plurality of light-emitting components 406. In some embodiments, hydroxyl groups are formed on the surface of the light-emitting component 406 by the surface treatment.

[Embodiment 5]

Embodiment 5 provides a method for forming a display device by transferring a plurality of light-emitting components to a substrate (e.g., thin-film transistor substrate).

First, as shown in FIG. 5A, a first carrier 500 with a first plurality of light-emitting components formed thereon is provided. The first plurality of light-emitting components includes a first group of light-emitting components (i.e., 502) and a second group of light-emitting components (i.e., 504). In some embodiments, the first group of light-emitting components (i.e., 502) and the second group of light-emitting components (i.e., 504) may be alternatively disposed. For example, the first carrier 500 may include a sapphire substrate, a silicon substrate, a silicon carbide substrate, other applicable carrier, or a combination thereof. In some embodiments, the light-emitting components 502 and 504 may include a light-emitting diode (lateral or vertical), an organic light-emitting diode, other applicable light-emitting components, or a combination thereof. In the present embodiment, the light-emitting components 502 and 504 are light-emitting diodes including connection features 502a and 504a (e.g., a bump or electrode of the light-emitting diode). In some embodiments, at least one of the first plurality of light-emitting components on the first carrier 500 is partially surrounded by a protection layer (e.g., the protection layer 110 shown in FIGS. 1B-1H).

Then, as shown in FIG. 5B, the first plurality of light-emitting components 502 and 504 are attached onto a first temporary substrate 506 through a first adhesion film 508. For example, the first temporary substrate 506 may be made of glass, polyimide, polyethylene terephthalate, other applicable materials, or a combination thereof. For example, the first adhesion film 508 may include a UV-light debondable adhesion film, a heat debondable adhesion film, other applicable adhesion film, or a combination thereof. In some embodiments, the first adhesion film 508 may be a glue, a tape, or a combination thereof. For example, a spin-on coating or other applicable method can be used to form the first adhesion film 508 on the first temporary substrate 506 before the first plurality of light-emitting components 502 and 504 are attached onto the first temporary substrate 506.

Figure 5C:
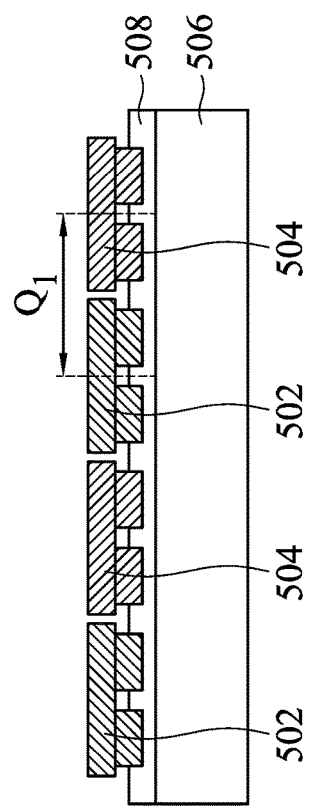

Then, as shown in FIG. 5C, the first carrier 500 is removed from the first plurality of light-emitting components 502 and 504. For example, the first carrier 500 can be removed by a laser lift-off process, a mechanical peeling, other applicable processes, or a combination thereof. For example, the laser source of the laser lift-off process may include an excimer laser, a pico laser, a femto laser, other applicable laser sources, or a combination thereof. In some embodiments, at least one of the first plurality of light-emitting components on the first temporary substrate 506 is partially surrounded by a protection layer (e.g., the protection layer 110 shown in FIGS. 1B-1H).

As shown in FIG. 5C, the first plurality of light-emitting components 502 and 504 are disposed on the first temporary substrate 506 at a pitch of $Q_1$ (e.g., the distance between the center lines of two adjacent light-emitting components of the first plurality of light-emitting components). In some embodiments, the pitch $Q_1$ may be 2 to 500 μm, whose value depends on the size of LED chips.

Figure 5D:
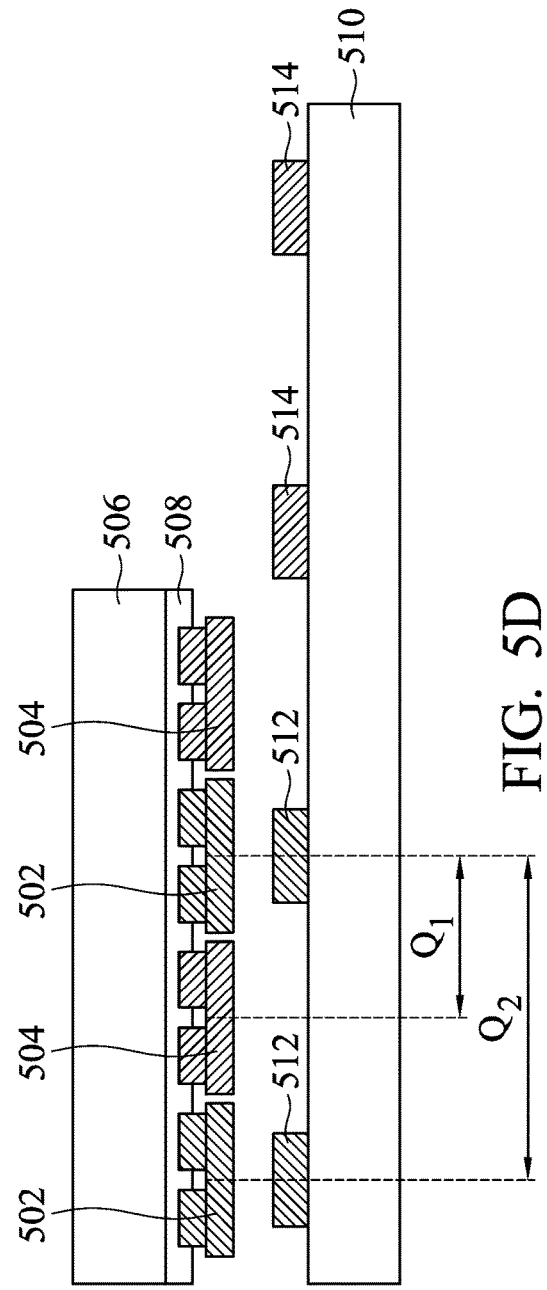

Then, as shown in FIG. 5D, a first transfer substrate 510 with a first plurality of adhesive pads (e.g., glue dots) thereon is provided. The first plurality of adhesive pads includes a first group of adhesive pads (i.e., 512) corresponding to the first group of the first plurality of light-emitting components (i.e., 502) and a second group of adhesive pads (i.e., 514) corresponding to the second group of the first plurality of light-emitting components (i.e., 504). As shown in FIG. 5D, the first plurality of adhesive pads are disposed on the first transfer substrate 510 at a pitch of $Q_2$ (e.g., the distance between the center lines of two adjacent adhesive pads of the first plurality of adhesive pads). In some embodiments, the pitch $Q_2$ of the first plurality of adhesive pads is an integer multiple of the pitch $Q_1$ of the first plurality of light-emitting components (e.g., $Q_2$ is substantially equal to twice $Q_1$ in the present embodiment). For example, the first plurality of adhesive pads may include a thermal plastic material, other applicable material, or a combination thereof. In some embodiments, the first plurality of adhesive pads can be formed by lithography process, ink jet, aerosol jet, other applicable processes, or a combination thereof. In some embodiments, the material of the first plurality of adhesive pads can include heat debondable materials and/or UV-light debondable materials.

Figure 5E:
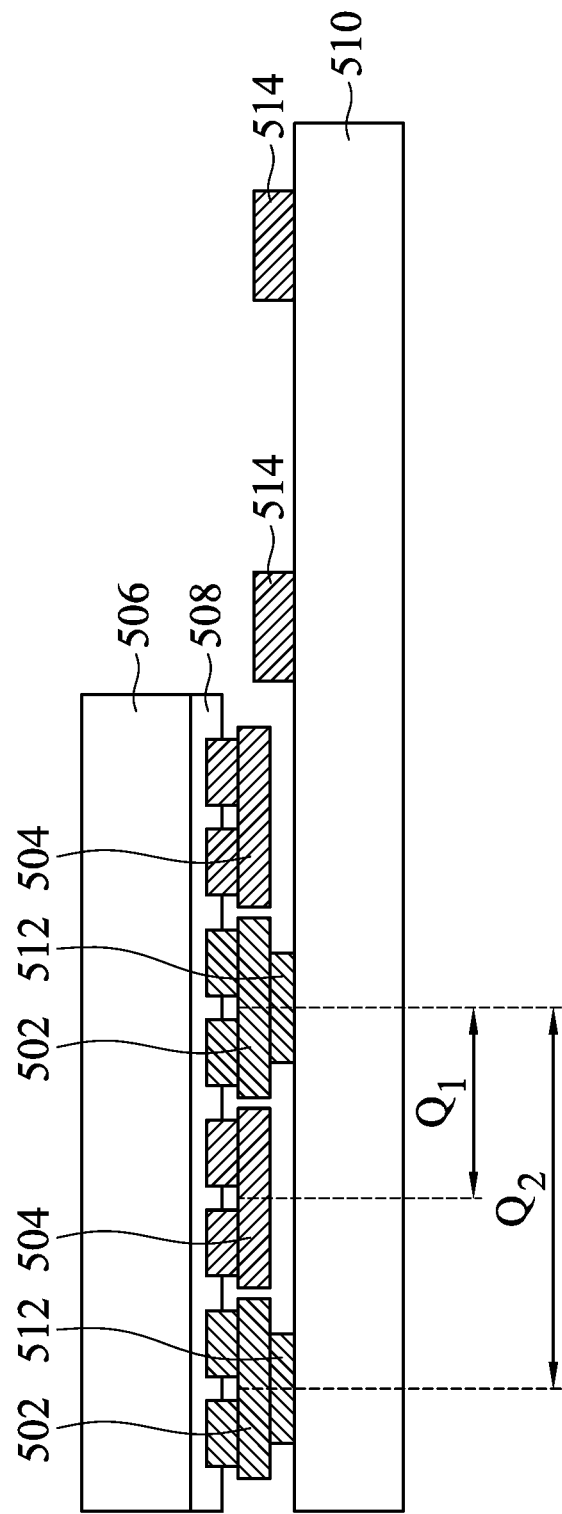

Then, as shown in FIG. 5E, the first group of the first plurality of light-emitting components (i.e., 502) are attached onto the first group of the first plurality of adhesive pads (i.e., 512) on the first transfer substrate 510 by an attachment process. In some embodiments, the attachment process compresses the first group of the first plurality of adhesive pads (i.e., 512), so that a thickness of the first group of the first plurality of adhesive pads (i.e., 512) is less than a thickness of the second group of the first plurality of adhesive pads (i.e., 514) after the attachment process (as shown in FIG. 5E).

In some embodiments, a heating process or another applicable process may be performed on the first group of the first plurality of adhesive pads (i.e., 512) before the attachment process, which may be advantageous to the attachment process by increasing the plasticity of the first group of the first plurality of adhesive pads (i.e., 512).

In some embodiments, since the pitch $Q_2$ of the first plurality of adhesive pads is an integer multiple of the pitch $Q_1$ of the first plurality of light-emitting components, the attachment process can selectively attach the first group of the first plurality of light-emitting components (i.e., 502) onto the first transfer substrate 510, while leaving the second group of the first plurality of light-emitting components (i.e., 504) remaining on the first temporary substrate 506.

Figure 5F:
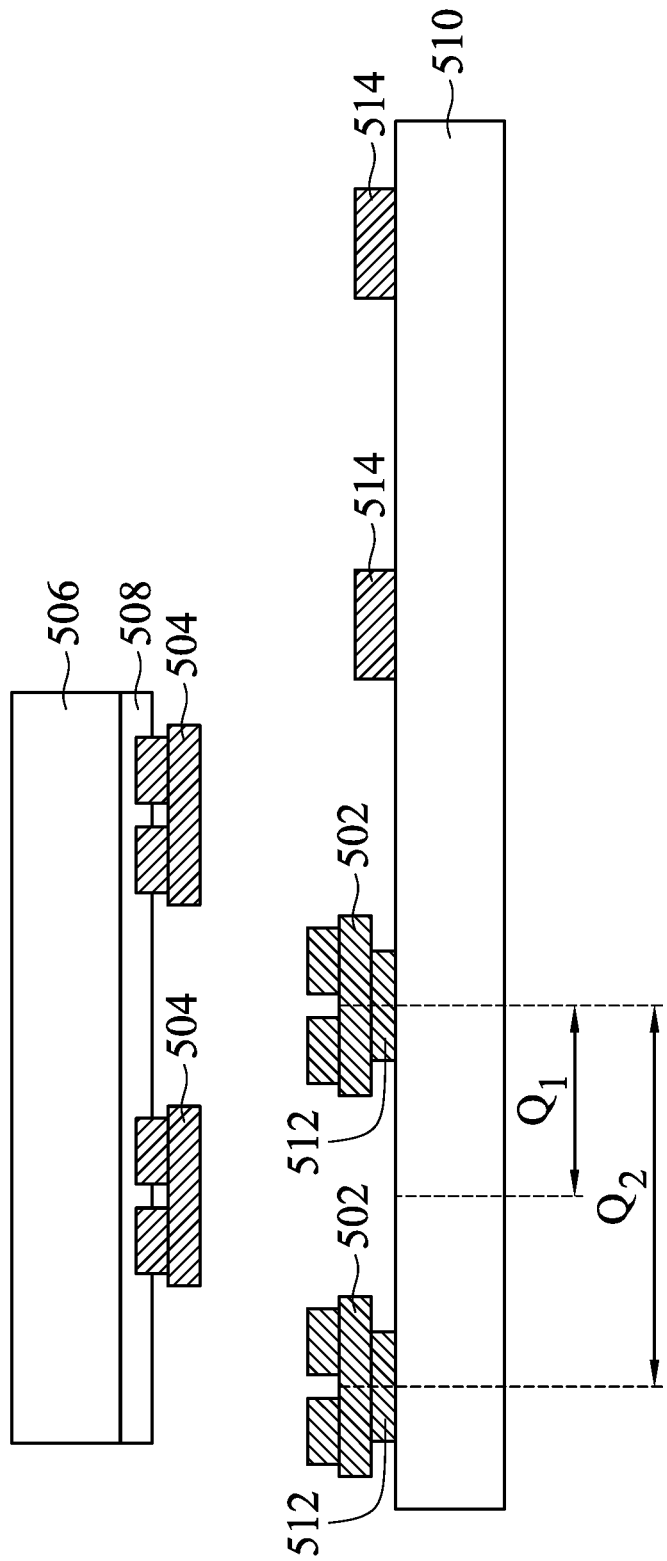

Then, as shown in FIG. 5F, the first temporary substrate 506, the first adhesion film 508, and the second group of the first plurality of light-emitting components (i.e., 504) are removed by a removal process, and the first group of the first plurality of light-emitting components (i.e., 502) are left on the first transfer substrate 510. In some embodiments, the first adhesion film 508 may be heated or exposed to a UV-light before the removal process, which may be advantageous to the removal process by reducing the bonding force between the adhesion film 508 and the first group of the first plurality of light-emitting components (i.e., 502).

Figure 5G:
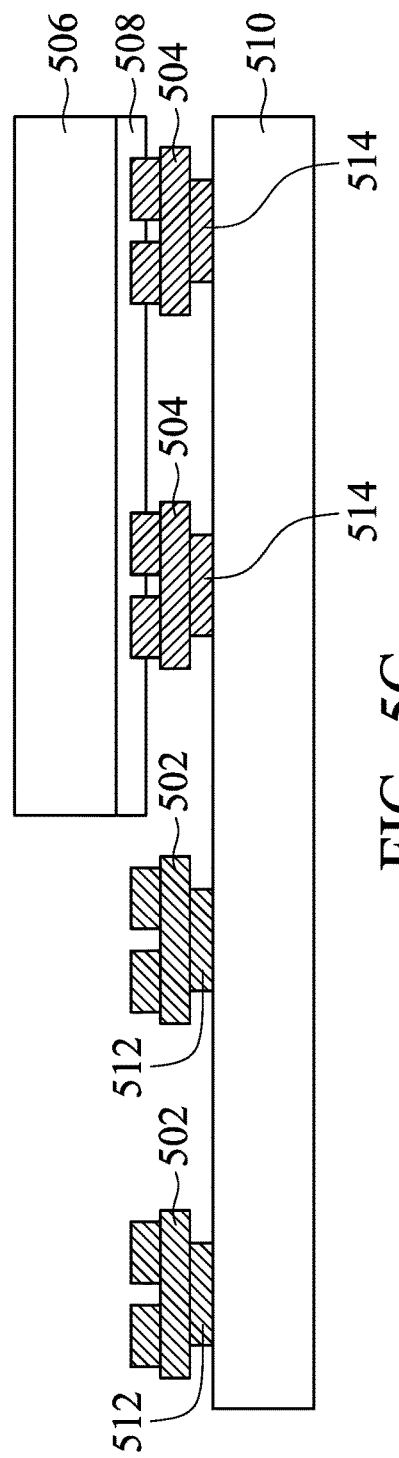

Then, as shown in FIG. 5G, the second group of the first plurality of light-emitting components (i.e., 504) are attached onto the second group of the first plurality of adhesive pads (i.e., 514) on the first transfer substrate 510 by an attachment process similar to the above attachment process for the first group of the first plurality of light-emitting components (i.e., 502).

Figure 5H:
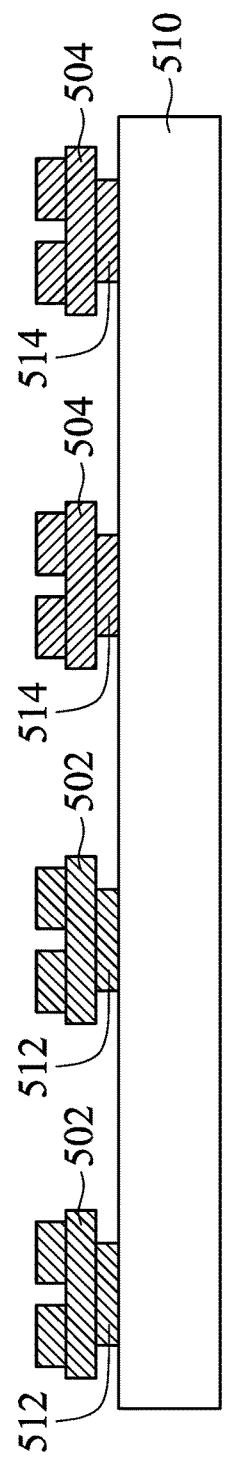

Then, as shown in FIG. 5H, the first temporary substrate 506 and the first adhesion film 508 are removed by a removal process, and the second group of the first plurality of light-emitting components (i.e., 504) is left on the first transfer substrate 510. In some embodiments, the first adhesion film 508 may be heated or exposed to a UV-light before the removal process, which may be advantageous to the attachment process by reducing the bonding force between the adhesion film 508 and the second group of the first plurality of light-emitting components (i.e., 504).

Then, as shown in FIG. 5I, the first plurality of light-emitting components (i.e., 502 and 504) are bonded onto a substrate 516 (e.g., thin-film transistor substrate). In some embodiments, the substrate 516 has one or more conductive pads and an adhesion film (e.g., anisotropic conductive film) formed thereon (not shown), and the first plurality of light-emitting components may be bonded to the substrate 516 through the adhesion film and the conductive pads by the eutectic bonding process discussed in the above embodiments.

Then, as shown in FIG. 5J, the first transfer substrate 510 and the first plurality of adhesive pads (i.e., 512 and 514) are removed from the first plurality of light-emitting components (i.e., 502 and 504) by a removal process. For example, the removal process may include heating the first plurality of adhesive pads, exposing the first plurality of adhesive pads to a UV-light, a laser lift off process, another applicable process, or a combination thereof.

Although not shown in the above figures, it should be noted that some additional elements such as a cover plate or an optical film may also be formed on the substrate 516 to protect the display device or improve its performance.

Figure 5K:
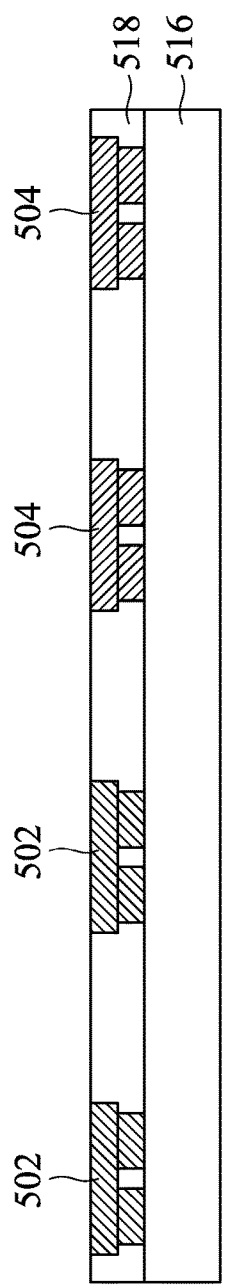

In some embodiments, a filler layer 518 may be formed on the substrate 516 before the first plurality of light-emitting components (i.e., 502 and 504) are bonded onto the substrate 516, so that the gap between adjacent light-emitting components can be filled by the filler layer (as shown in FIG. 5K). In some embodiments, a curing process may be performed to cure the filler layer 518 after the first plurality of light-emitting components (i.e., 502 and 504) are bonded onto the substrate 516. For example, the filler layer 518 may include glass, polyimide, flux, micro/nano particles, other applicable materials, or a combination thereof.

Figure 5L:
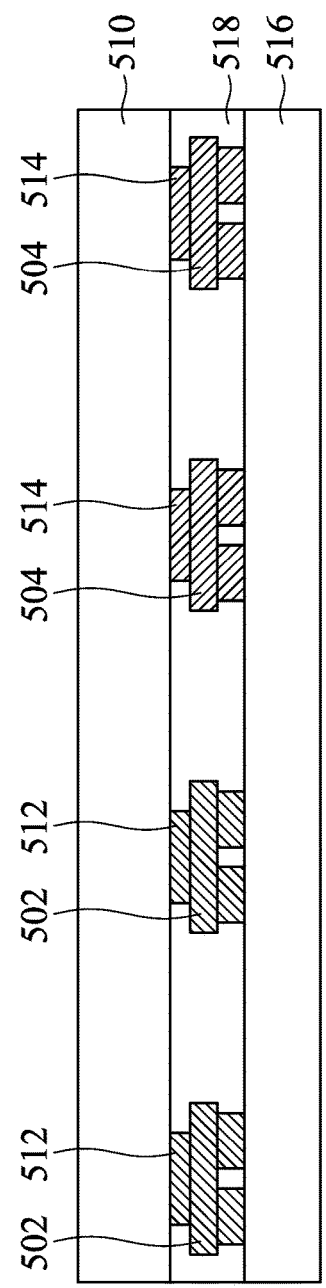

In some embodiments, the first transfer substrate 510 may not be removed after the first plurality of light-emitting components (i.e., 502 and 504) are bonded onto the substrate 516 (as shown in FIG. 5L). In such embodiments, the first transfer substrate 510 may provide the display device with some advantageous functions (e.g., mechanical protection or optical conversion).

In some embodiments, the first plurality of adhesive pads (i.e., 512 and 514) are formed by ink jet or aerosol jet after performing a testing process to test the quality of the first plurality of light-emitting components (i.e., 502 and 504), and thus the pattern of the first plurality of adhesive pads can be adjusted according to the test results to avoid the abnormal light-emitting components being transferred to the first transfer substrate 510. In some embodiments, the first plurality of adhesive pads (i.e., 512 and 514) are formed by ink jet or aerosol jet before or after performing a testing process to test the quality of the first plurality of light-emitting components (i.e., 502 and 504), and some of the first plurality of adhesive pads corresponding to the light-emitting components having abnormal quality (e.g., according to the test results) may be removed by a removal process (e.g., a laser process) before the attachment process to avoid the abnormal light-emitting components being transferred to the first transfer substrate 510.

[Embodiment 6]

Embodiment 6 provides a method for forming a display device. One difference between Embodiment 5 and Embodiment 6 is that two or more transfer substrates are used in Embodiment 6.

Figure 6A:
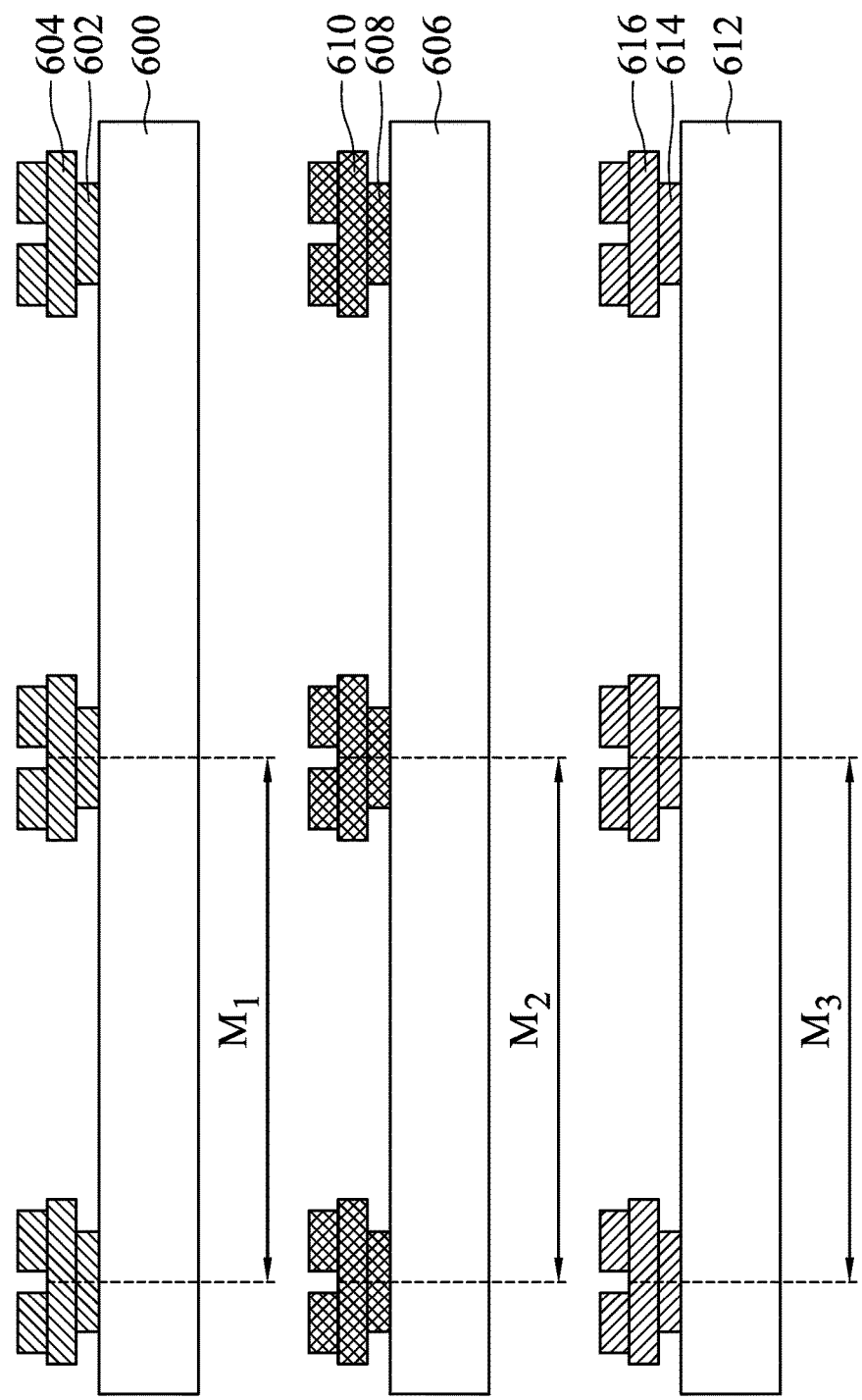
FIGS. 6A, 6B, 6C, and 6D are a series of cross-sectional views illustrating a method for forming a display device according to some embodiments of the present disclosure.

First, as shown in FIG. 6A, a first transfer substrate 600 with a first plurality of light-emitting components 604 formed thereon is provided. The first plurality of light-emitting components 604 are attached onto the first transfer substrate 600 through a first plurality of adhesive pads 602. The first plurality of adhesive pads 602 have a pitch of $M_1$, which may be substantially equal to a pitch of the first plurality of light-emitting components 604 on the first transfer substrate 600.

Still referring to FIG. 6A, a second transfer substrate 606 with a second plurality of light-emitting components 610 formed thereon is also provided. The second plurality of light-emitting components 610 are attached onto the second transfer substrate 606 through a second plurality of adhesive pads 608. The second plurality of adhesive pads 608 have a pitch of $M_2$, which may be substantially equal to a pitch of the second plurality of light-emitting components 610 on the second transfer substrate 606.

Still referring to FIG. 6A, a third transfer substrate 612 with a third plurality of light-emitting components 616 formed thereon is also provided. The third plurality of light-emitting components 616 are attached onto the third transfer substrate 612 through a third plurality of adhesive pads 614. The third plurality of adhesive pads 614 have a pitch of $M_3$, which may be substantially equal to a pitch of the third plurality of light-emitting components 616 on the third transfer substrate 612.

The transfer substrates, the adhesive pads and the light-emitting components of the present embodiment may be the same as, or similar to, the above embodiments, and may be formed using the same or similar methods as disclosed in the above embodiments.

In some embodiments, the pitch $M_1$ of the first plurality of adhesive pads 602, the pitch $M_2$ of the second plurality of adhesive pads 608, and the pitch $M_3$ of the third plurality of adhesive pads 614 may be substantially the same.

In some embodiments, the first plurality of light-emitting components 604 includes light-emitting diodes of a first color, the second plurality of light-emitting components 610 includes light-emitting diodes of a second color, and the third plurality of light-emitting components 616 includes light-emitting diodes of third color. In some embodiments, the first color, the second color, and the third color are different from each other, and are selected from red, green, and blue.

Figure 6B:
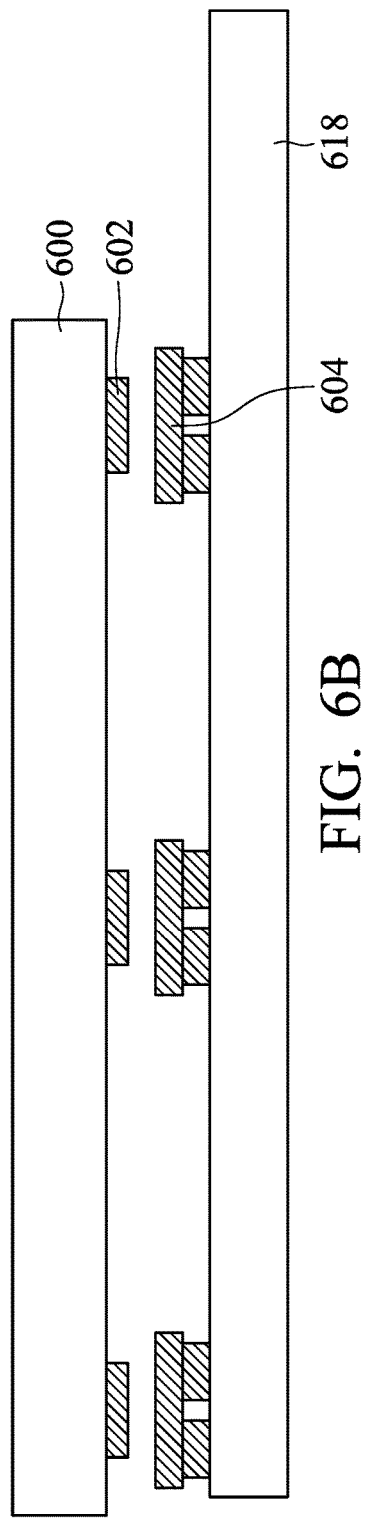

Then, as shown in FIG. 6B, a bonding process is performed to bond the first plurality of light-emitting components 604 onto a substrate 618 (e.g., thin-film transistor substrate). Then, the first transfer substrate 600 and the first plurality of adhesive pads 602 are removed from the first plurality of light-emitting components 604.

Figure 6C:
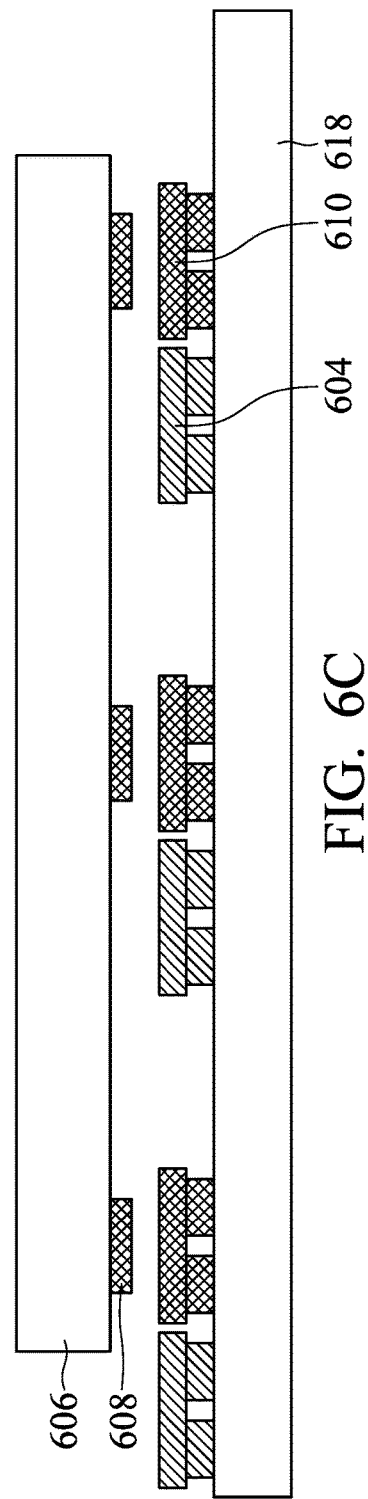

Then, as shown in FIG. 6C, another bonding process is performed to bond the second plurality of light-emitting components 610 onto the substrate 618. Then, the second transfer substrate 606 and the second plurality of adhesive pads 608 are removed from the second plurality of light-emitting components 610.

Figure 6D:
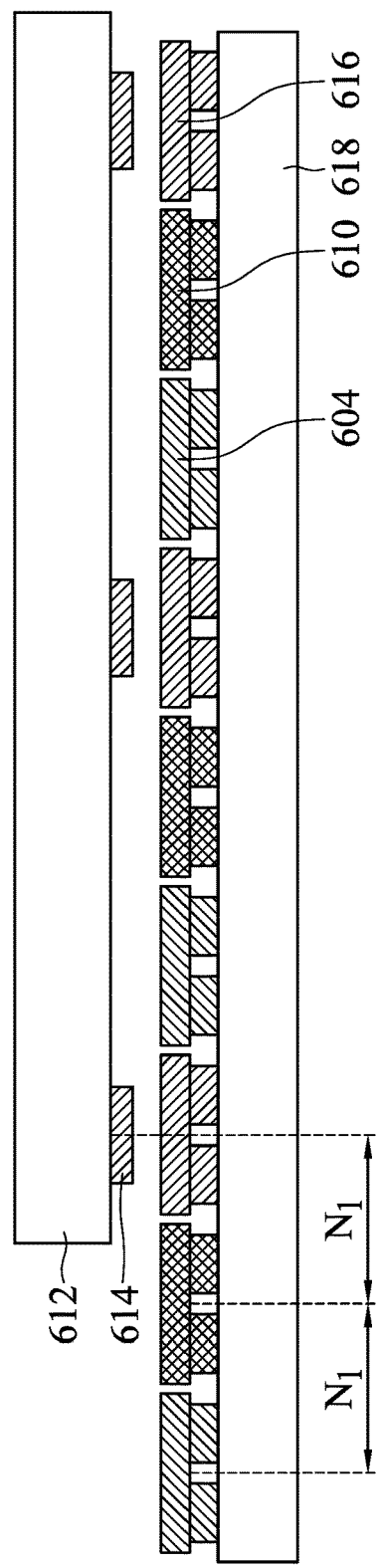

Then, as shown in FIG. 6D, another bonding process is performed to bond the third plurality of light-emitting components 616 onto the substrate 618. Then, the third transfer substrate 612 and the third plurality of adhesive pads 614 are removed from the third plurality of light-emitting components 616.

In some embodiments, the pitch $M_1$ of the first plurality of adhesive pads 602, the pitch $M_2$ of the second plurality of adhesive pads 608, and the pitch $M_3$ of the third plurality of adhesive pads 614 may respectively be an integer multiple of a pitch $N_1$ (as shown in FIG. 6D) of the light-emitting components transferred to the substrate 618 (i.e., 604, 610, and 616). For example, the pitch $M_1$ may is substantially three times the pitch $N_1$ in the present embodiment.

Although not shown in the above figures, it should be noted that some additional elements such as a cover plate or an optical film may also be formed on the substrate 618 to protect the display device or improve its performance.

In some embodiments, a filler layer (not shown) may be formed on the substrate 618 before the light-emitting components (i.e., 604, 610, and 616) are bonded onto the substrate 618, so that the gap between adjacent light-emitting components can be filled by the filler layer. In some embodiments, a curing process may be performed to cure the filler layer after the light-emitting components (i.e., 604, 610, and 616) are bonded onto the substrate 618. For example, the filler layer may include glass, polyimide, other applicable materials, or a combination thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. In addition, each claim can be an individual embodiment of the present disclosure, and the scope of the present disclosure includes the combinations of every claim and every embodiment of the present disclosure.

What is claimed is:

1. A display device, comprising:
    a thin-film transistor substrate;
    a conductive pad disposed on the thin-film transistor substrate;
    an adhesion film disposed on the conductive pad, the adhesion film comprising a plurality of conductive particles;
    a light-emitting component disposed on the adhesion film, the light-emitting component comprising a first connection feature and a second connection feature; and
    a protection layer partially surrounding the light-emitting component, wherein each of the first connection feature and the second connection feature has a lower portion not surrounded by the protection layer and the protection layer between the first connection feature and the second connection feature comprises an organic sub-layer and an inorganic sub-layer, and
    wherein the adhesion film has a thickness of T, one of the plurality of conductive particles has a diameter of d, the lower portion of the connection feature has a thickness of t, and $0 < t \leq T-d$.

2. The display device as claimed in claim 1, wherein the connection feature comprises a first bump and a second bump, a distance G is between the first bump and the second bump, and $d \leq G/2$.

3. The display device as claimed in claim 2, wherein the protection layer fills a gap between the first bump and the second bump.

4. The display device as claimed in claim 1, wherein $d \leq T \leq 3d$.

5. The display device as claimed in claim 1, wherein the lower portion of the connection feature comprises a first metal, the conductive pad comprises a second metal, the plurality of conductive particles comprises a third metal, and wherein the first metal comprises Sn, Ag, In, Cu, Au, Zn, Bi, Sb, or a combination thereof, the second metal comprises Sn, Ag, In, Cu, Au, Zn, Bi, Sb, or a combination thereof, and the third metal comprises Sn, Ag, In, Cu, Au, Ni, Pd, Cr, Al, Ti, or a combination thereof.

6. The display device as claimed in claim 1, wherein the lower portion of the connection feature comprises a first metal, the conductive pad comprises a second metal, the plurality of conductive particles comprises a third metal, and wherein the first metal comprises Sn, Ag, In, Cu, Au, Zn, Bi, Sb, Ni, Pd, Cr, Al, Ti, or a combination thereof, the second metal comprises Sn, Ag, In, Cu, Au, Zn, Bi, Sb, Ni, Pd, Cr, Al, Ti, or a combination thereof, and the third metal comprises Sn, Ag, In, Cu, Au, Zn, Bi, Sb, or a combination thereof.

7. The display device as claimed in claim 1, wherein the protection layer comprises an organic sub-layer and an inorganic sub-layer surrounding the organic sub-layer.

8. The display device as claimed in claim 7, wherein outermost sidewalls of the organic sub-layer is between outermost sidewalls of the light-emitting component.

9. The display device as claimed in claim 8, wherein outermost sidewalls of the inorganic sub-layer is between outermost sidewalls of the light-emitting component.

10. The display device as claimed in claim 7, wherein the protection layer further comprises another inorganic sub-layer, and the organic sub-layer is interposed between the inorganic sub-layer and the another inorganic sub-layer.

11. A light-emitting structure, comprising:
    a light-emitting component comprising a first connection feature and a second connection feature; and
    a protection layer partially surrounding the light-emitting component and filling a gap between the first connection feature and the second connection feature of the light-emitting component, wherein the protection layer between the first connection feature and the second connection feature comprises an organic sub-layer and an inorganic sub-layer.

12. The light-emitting structure as claimed in claim 11, wherein the inorganic sub-layer is the outermost layer of the protection layer.

13. The light-emitting structure as claimed in claim 11, wherein outermost sidewalls of the organic sub-layer is between outermost sidewalls of the light-emitting component.

14. The light-emitting structure as claimed in claim 13, wherein outermost sidewalls of the inorganic sub-layer is between outermost sidewalls of the light-emitting component.

15. The light-emitting structure as claimed in claim 11, wherein the protection layer further comprises another inorganic sub-layer, and the organic sub-layer is interposed between the inorganic sub-layer and the another inorganic sub-layer.

16. The light-emitting structure as claimed in claim 11, wherein a thickness of the organic sub-layer is 0.1 µm to 10 µm.

17. The light-emitting structure as claimed in claim 11, wherein a thickness of the inorganic sub-layer is 0.1 µm to 10 µm.

18. The light-emitting structure as claimed in claim 11, wherein a thickness of the organic sub-layer is different from a thickness of the inorganic sub-layer.

* * * * *